US009443910B1

(12) United States Patent
Fujiwara et al.

(10) Patent No.: US 9,443,910 B1
(45) Date of Patent: Sep. 13, 2016

(54) SILICIDED BIT LINE FOR REVERSIBLE-RESISTIVITY MEMORY

(71) Applicant: SanDisk 3D LLC, Milpitas, CA (US)

(72) Inventors: Kan Fujiwara, Yokkaichi (JP); Takuya Futase, Nagoya (JP); Toshihiro Iizuka, Yokkaichi (JP); Shin Kikuchi, Nagoya (JP); Yoichiro Tanaka, Nagoya (JP); Akio Nishida, Nagoya (JP); Christopher J Petti, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/795,211

(22) Filed: Jul. 9, 2015

(51) Int. Cl.
*H01L 27/115* (2006.01)
*H01L 27/24* (2006.01)
*H01L 45/00* (2006.01)
*H01L 21/822* (2006.01)

(52) U.S. Cl.
CPC ....... *H01L 27/2481* (2013.01); *H01L 27/2436* (2013.01); *H01L 45/08* (2013.01); *H01L 45/12* (2013.01); *H01L 45/1253* (2013.01); *H01L 45/146* (2013.01); *H01L 45/1608* (2013.01); *H01L 21/8221* (2013.01); *H01L 27/249* (2013.01); *H01L 27/2454* (2013.01)

(58) Field of Classification Search
CPC ........... H01L 26/0688; H01L 27/1151; H01L 21/8221; H01L 27/2454; H01L 27/249
USPC .......................... 257/529, 536, 754; 438/238
See application file for complete search history.

(56) References Cited

U.S. PATENT DOCUMENTS

| | | | |
|---|---|---|---|
| 7,989,902 B2 | 8/2011 | Ando et al. | |
| 8,907,409 B2 | 12/2014 | Myung et al. | |
| 8,933,502 B2 | 1/2015 | Higashitani et al. | |
| 2010/0219392 A1 | 9/2010 | Awaya et al. | |
| 2011/0049465 A1* | 3/2011 | Nagashima | H01L 27/0207 257/5 |
| 2011/0127483 A1* | 6/2011 | Sonehara | G11C 13/0002 257/2 |

(Continued)

FOREIGN PATENT DOCUMENTS

JP 2010287872 A 12/2010

OTHER PUBLICATIONS

English Abstract of Japanese Publication No. JP2010287872 published on Dec. 24, 2010.

*Primary Examiner* — George Fourson, III
(74) *Attorney, Agent, or Firm* — Vierra Magen Marcus LLP

(57) ABSTRACT

A three-dimensional (3D) non-volatile memory array having a silicide bit line and method of fabricating is disclosed. The fabrication technique may comprise forming a metal silicide for at least a portion of the bit line. The device has reversible resistivity material between the word lines and the bit lines. The reversible resistivity material may be a metal oxide. The metal that is used to form the silicide may serve as an oxygen scavenger to draw oxygen away from the silicon, thus preventing formation of silicon oxide between the reversible resistivity material and the bit line. The metal silicide may also help prevent formation of a depletion layer in silicon in the bit line.

25 Claims, 33 Drawing Sheets

(56) References Cited

U.S. PATENT DOCUMENTS

| | | | |
|---|---|---|---|
| 2011/0260131 A1* | 10/2011 | Sonehara | H01L 27/2409 257/2 |
| 2012/0211721 A1* | 8/2012 | Kawai | H01L 27/2409 257/4 |
| 2012/0313068 A1* | 12/2012 | Sakotsubo | H01L 45/04 257/2 |
| 2013/0153851 A1* | 6/2013 | Park | H01L 43/08 257/4 |
| 2014/0048761 A1* | 2/2014 | Nojiri | H01L 45/146 257/2 |
| 2014/0054538 A1* | 2/2014 | Park | H01L 27/249 257/5 |
| 2014/0203237 A1 | 7/2014 | Chien et al. | |
| 2014/0252454 A1 | 9/2014 | Rabkin et al. | |
| 2014/0301131 A1 | 10/2014 | Siau et al. | |
| 2015/0028279 A1 | 1/2015 | Hopstaken et al. | |

* cited by examiner

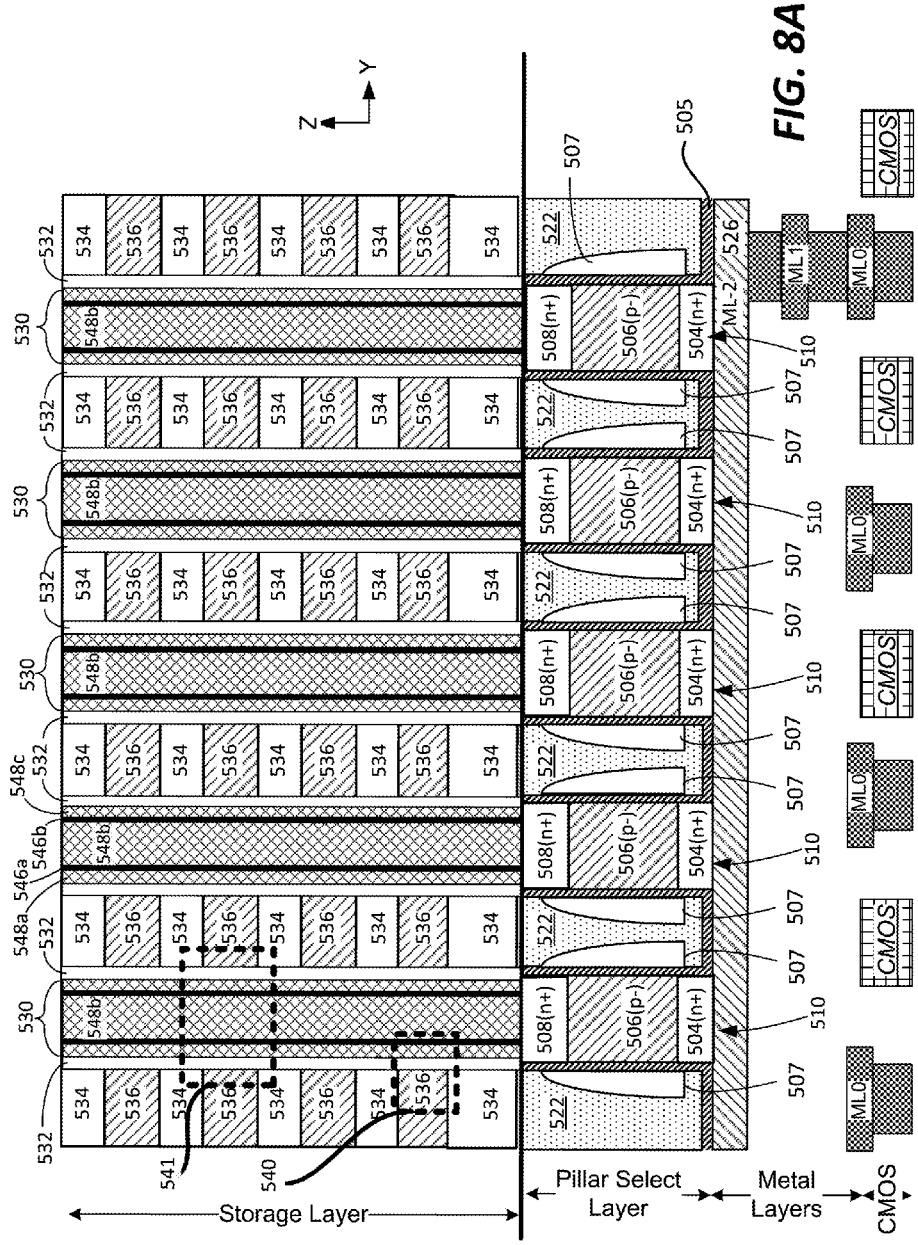

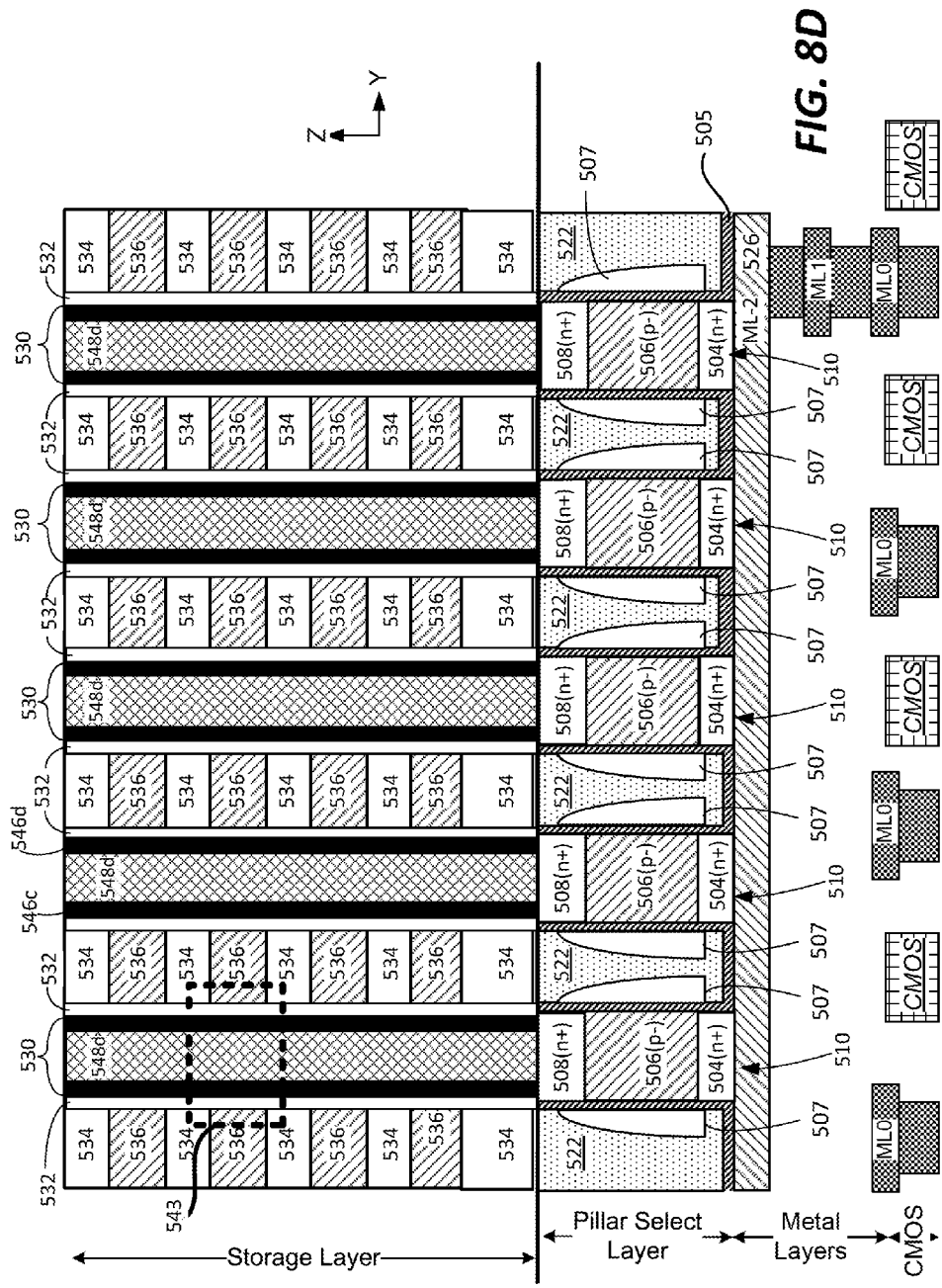

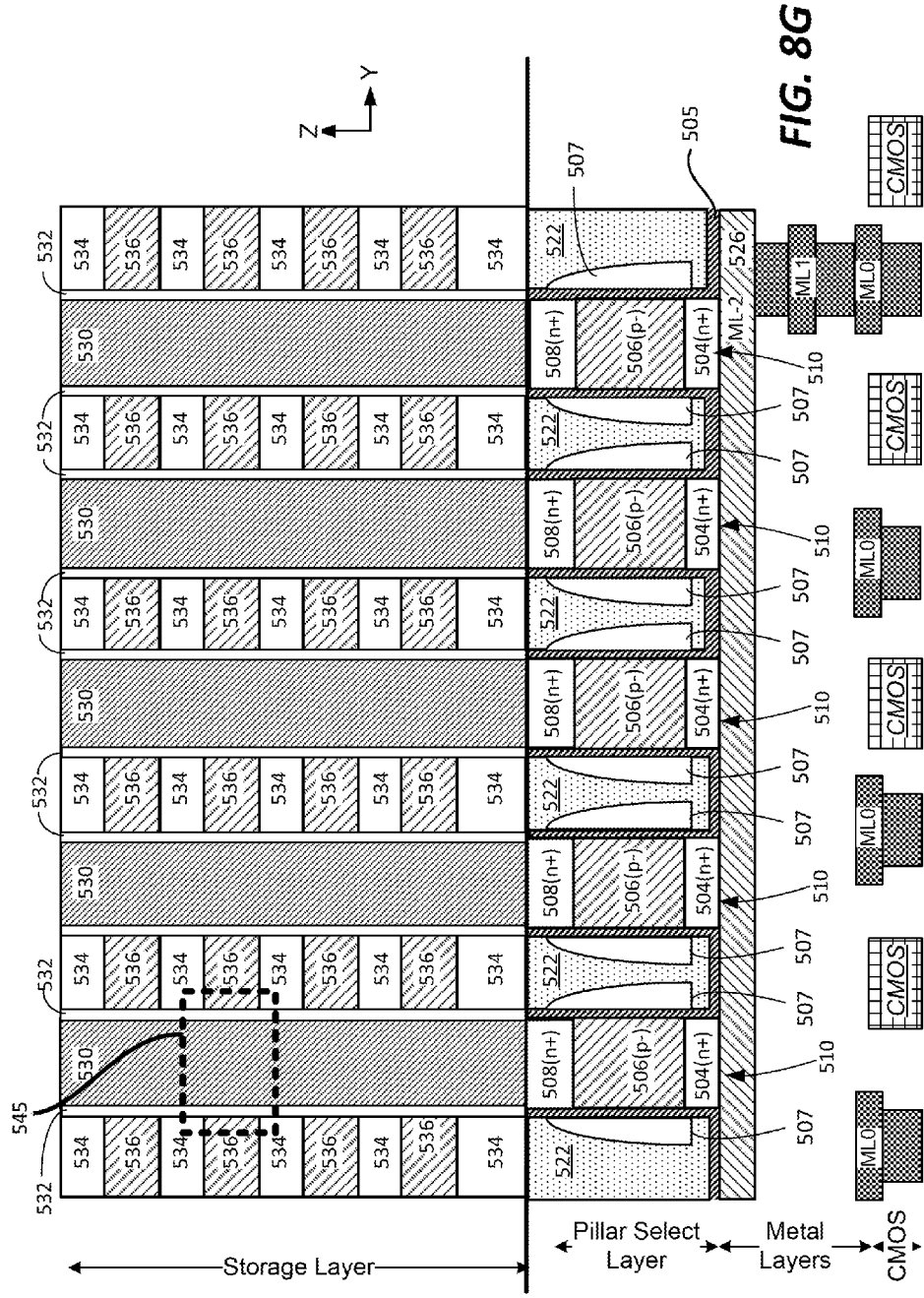

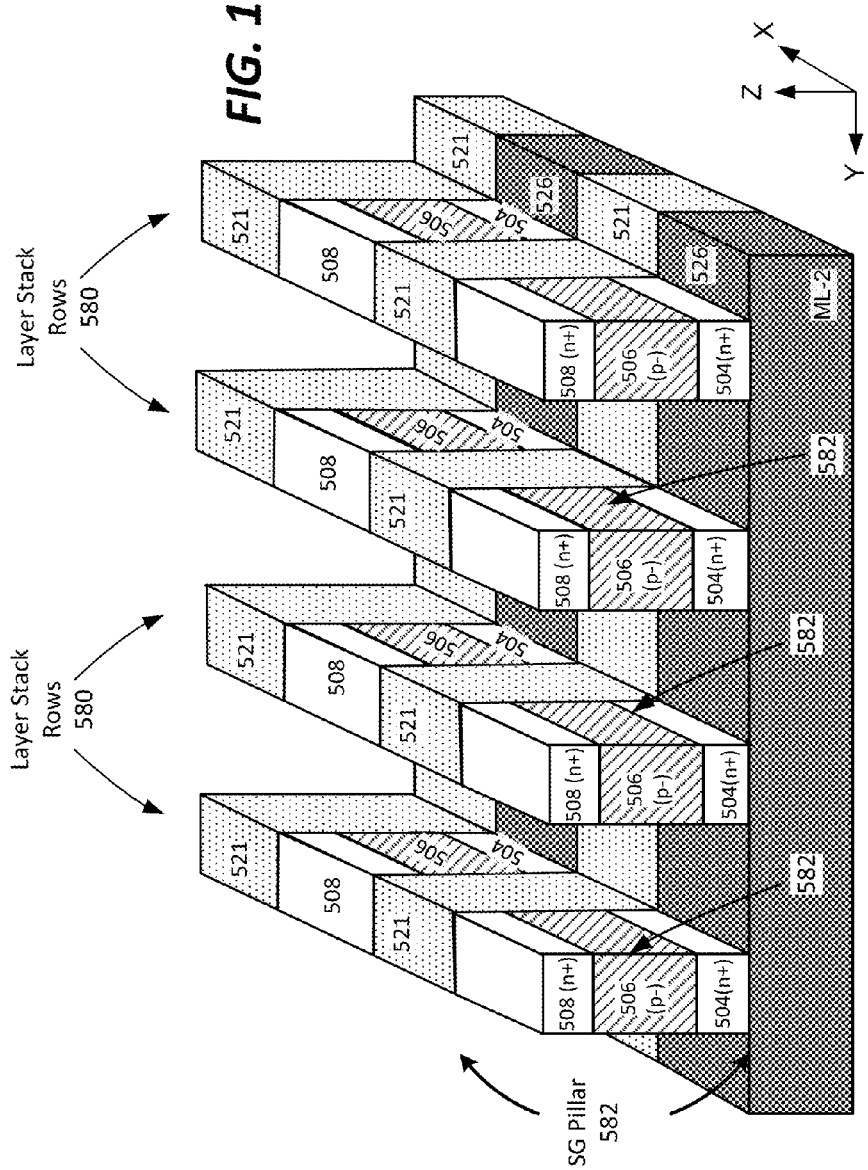

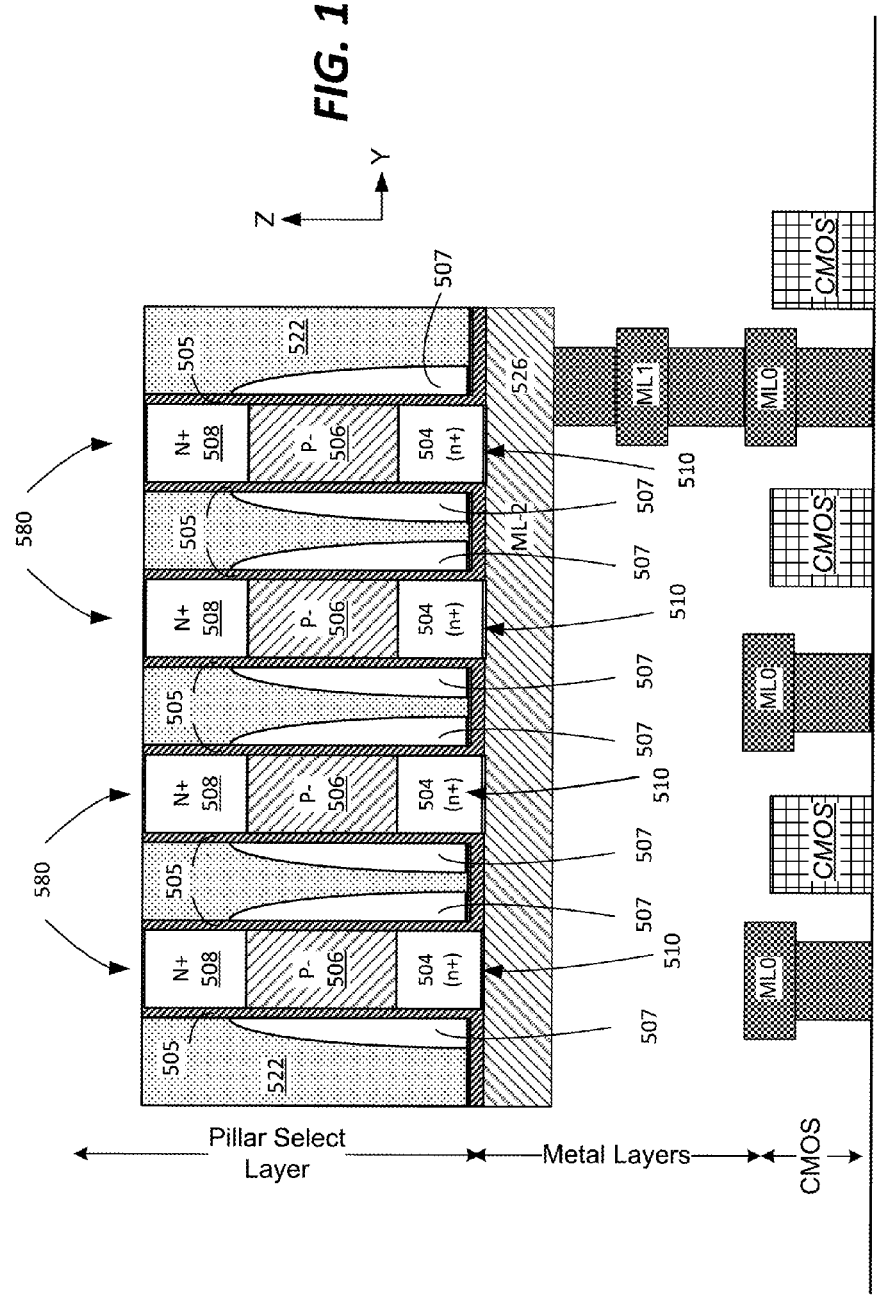

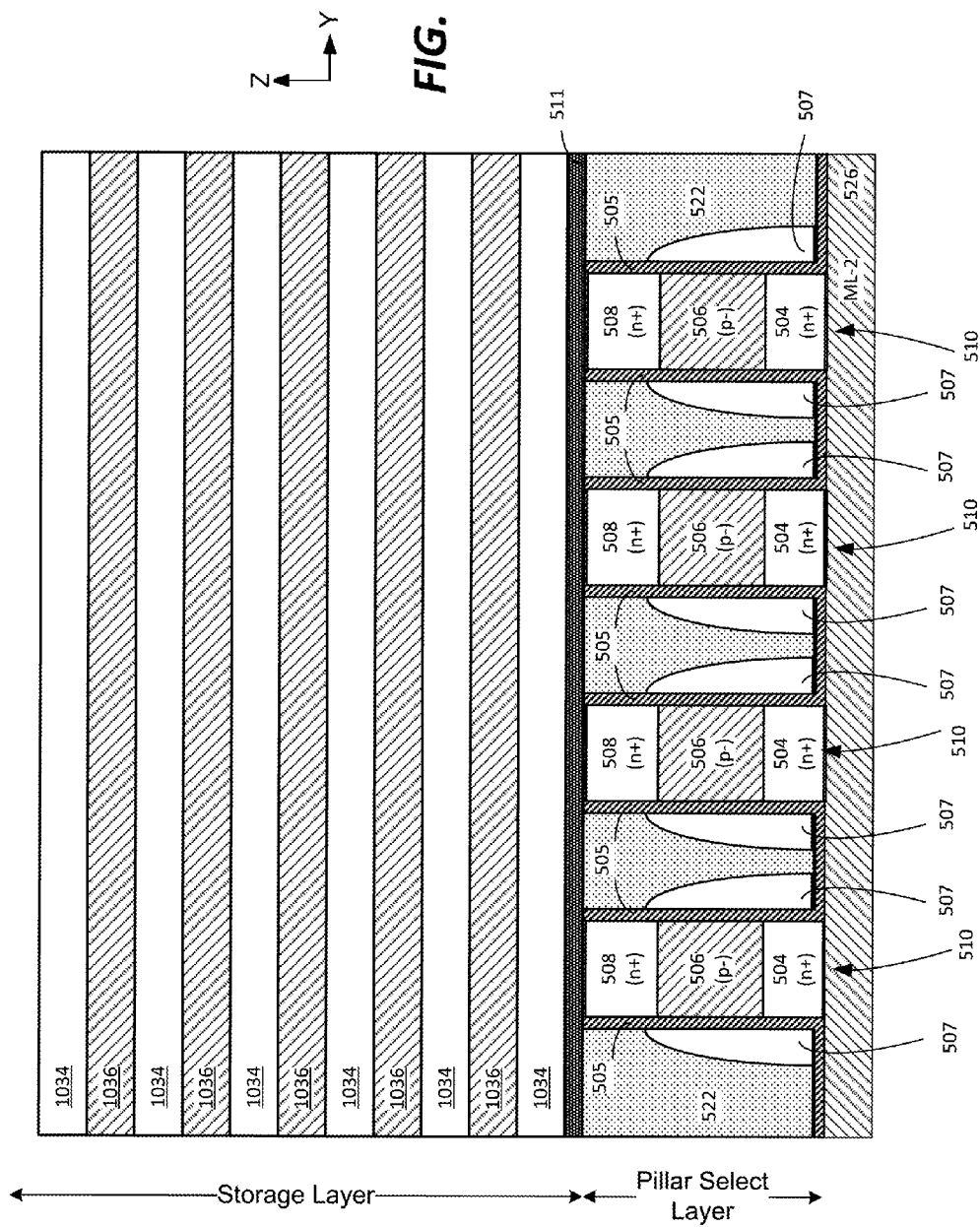

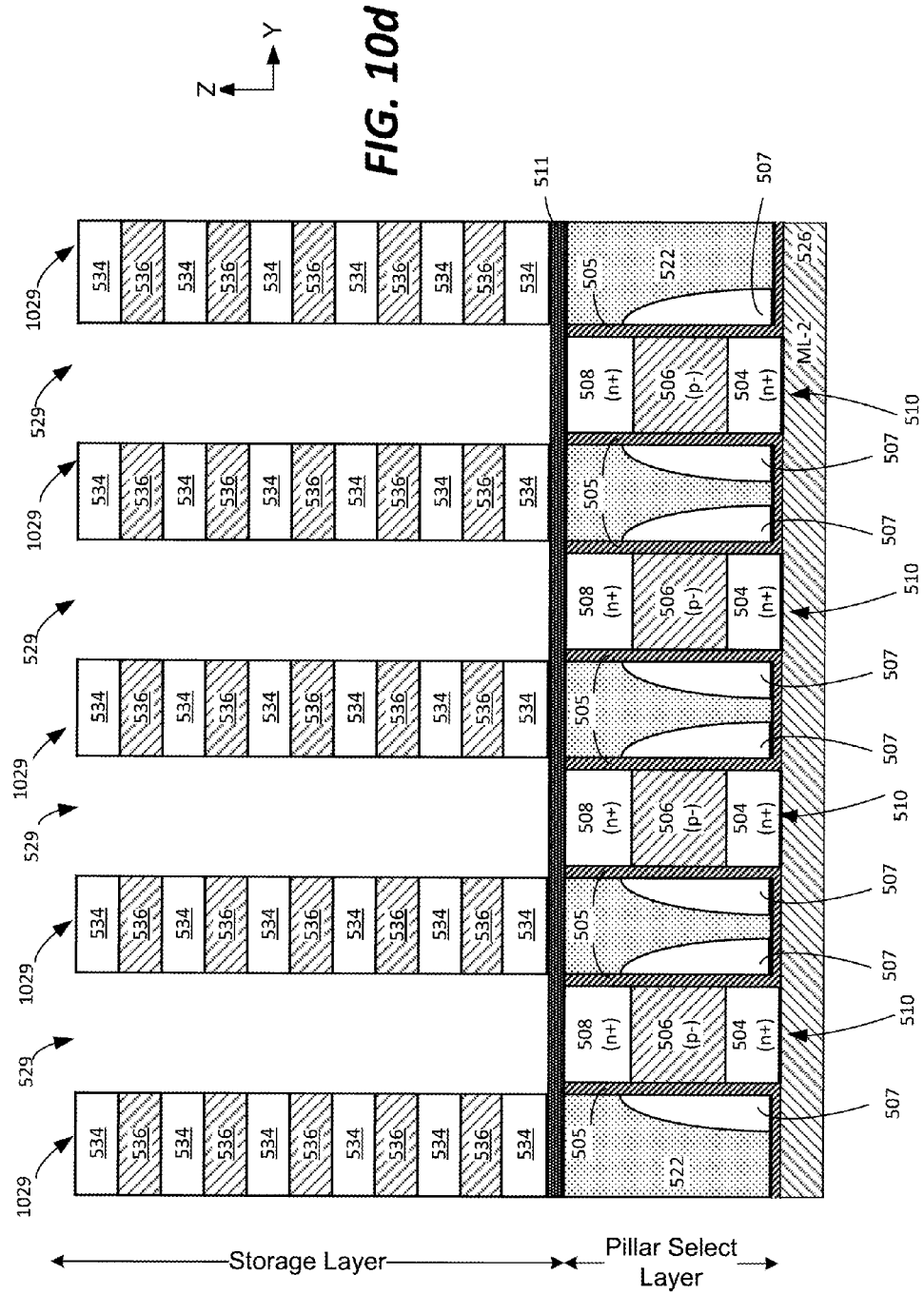

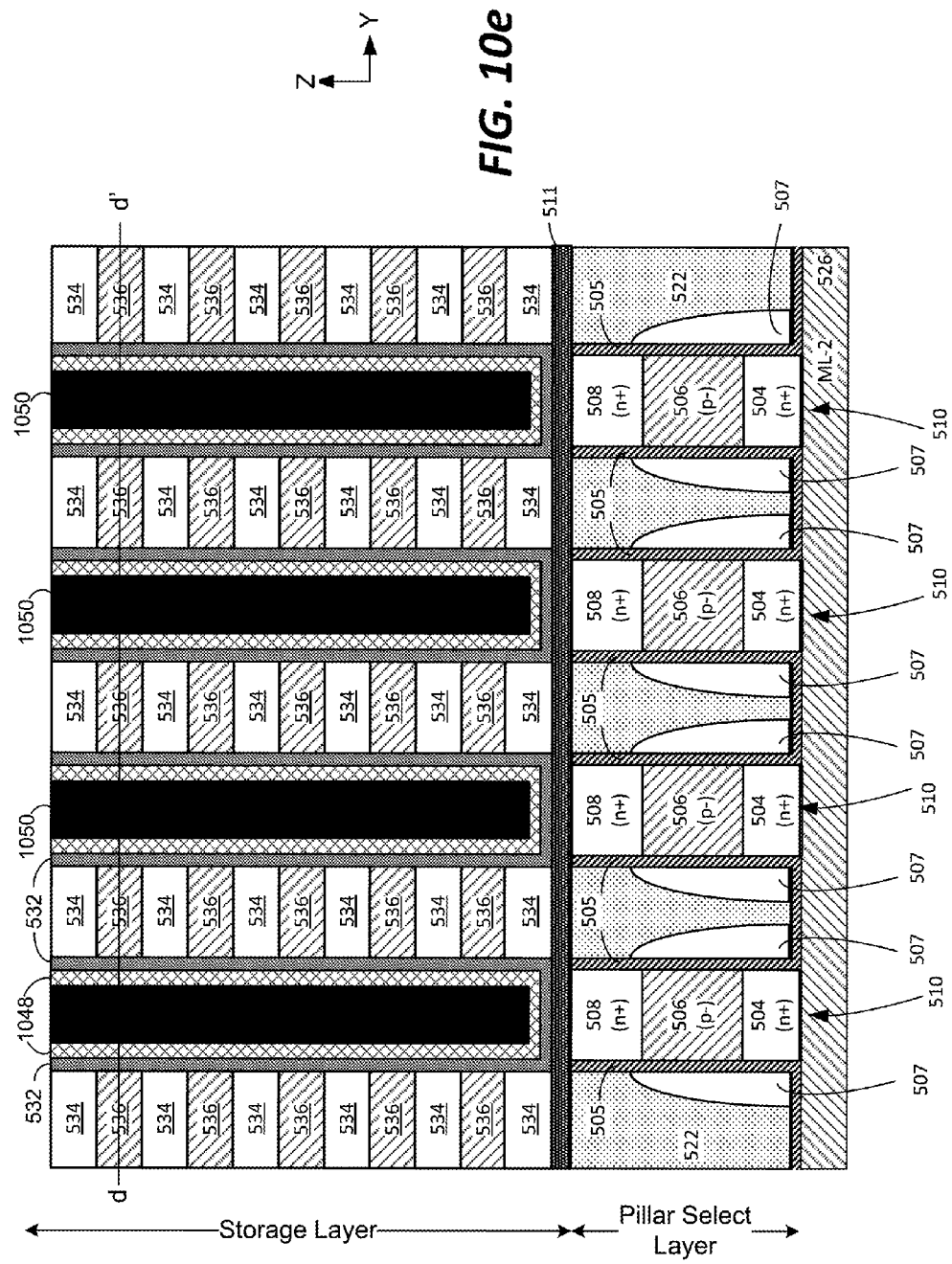

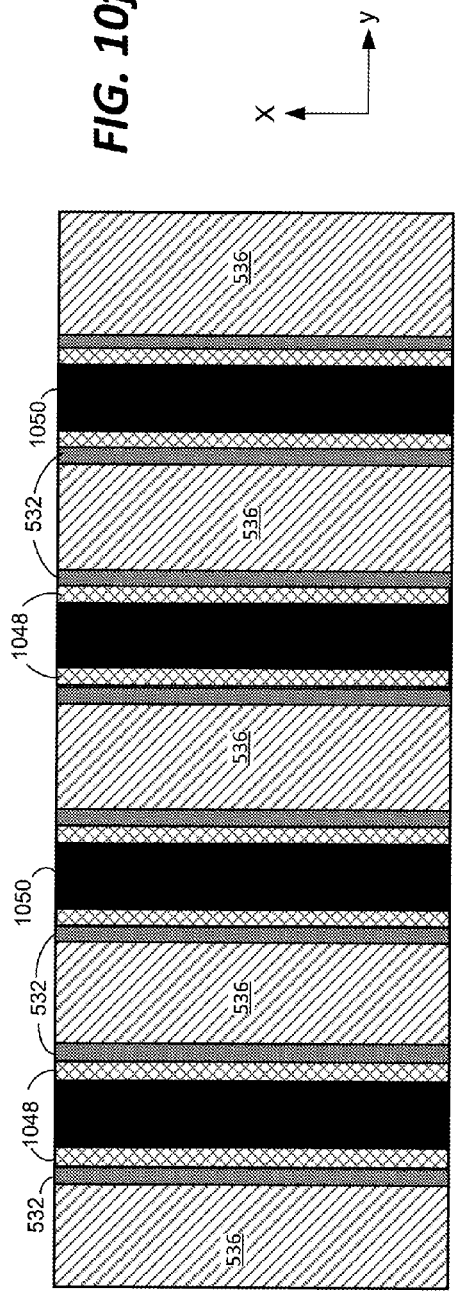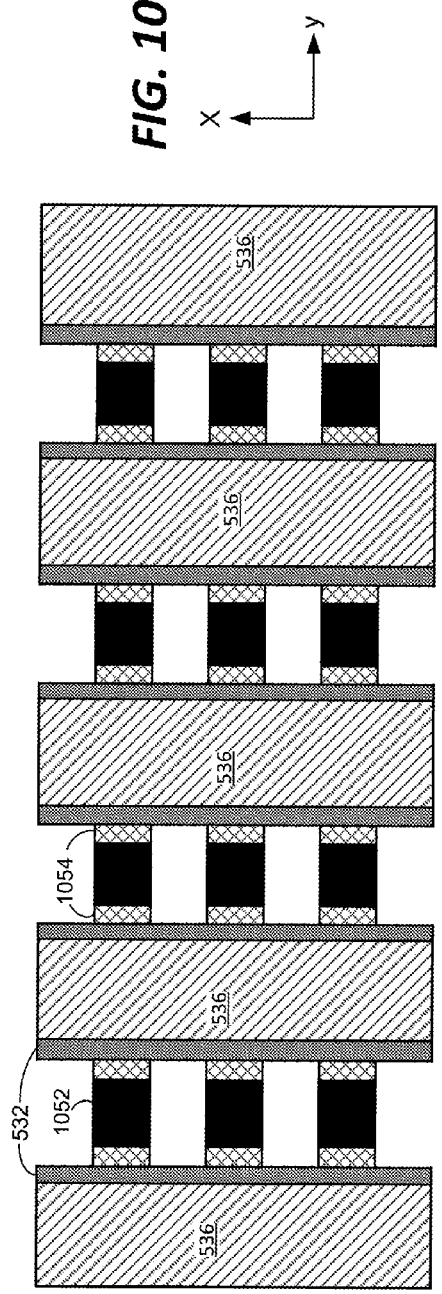

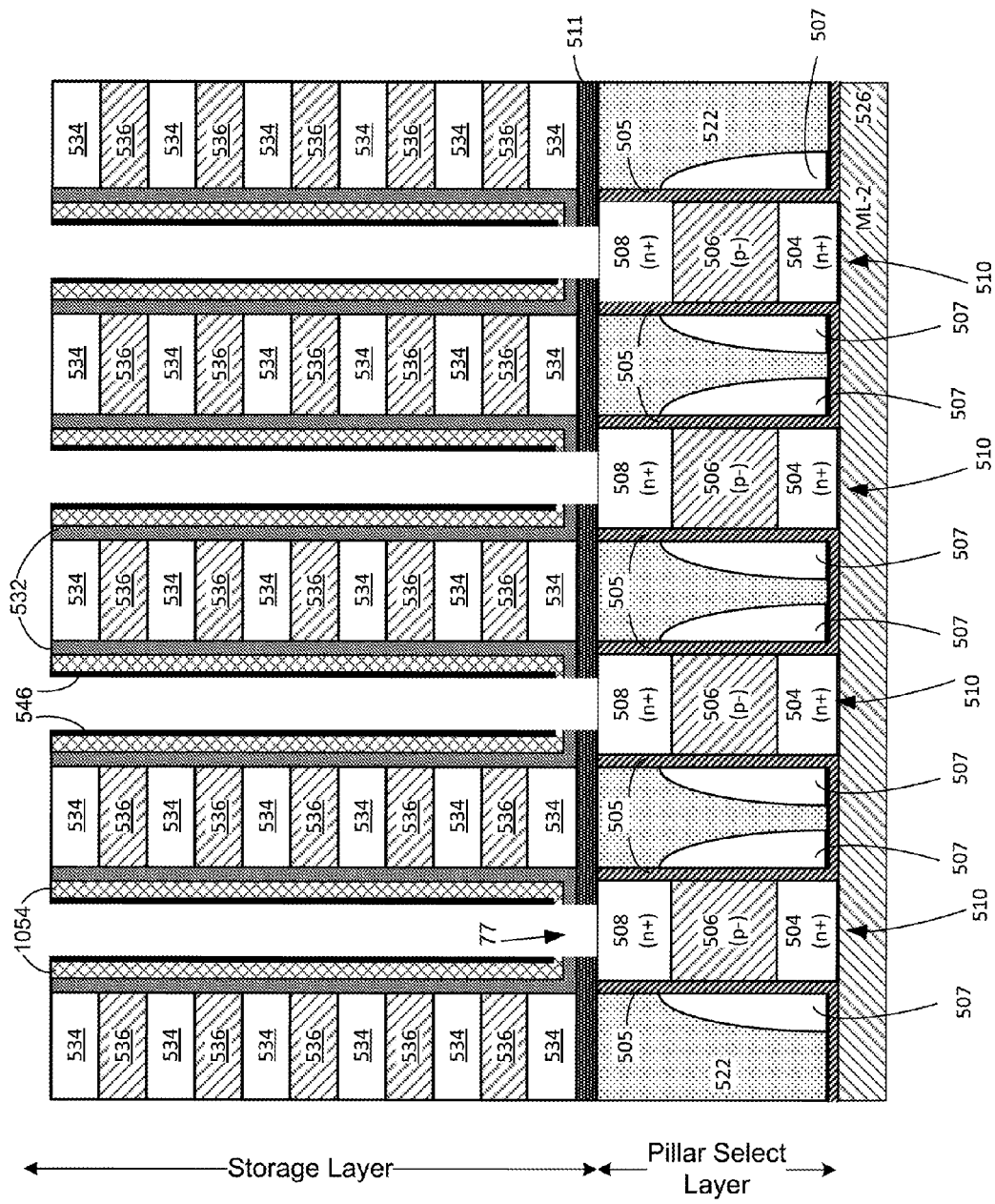

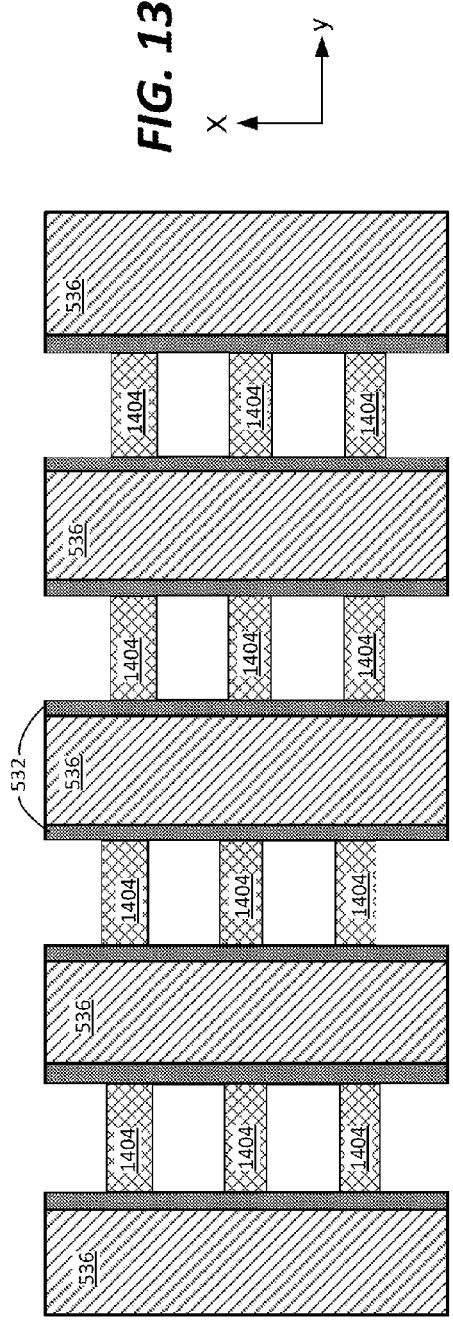
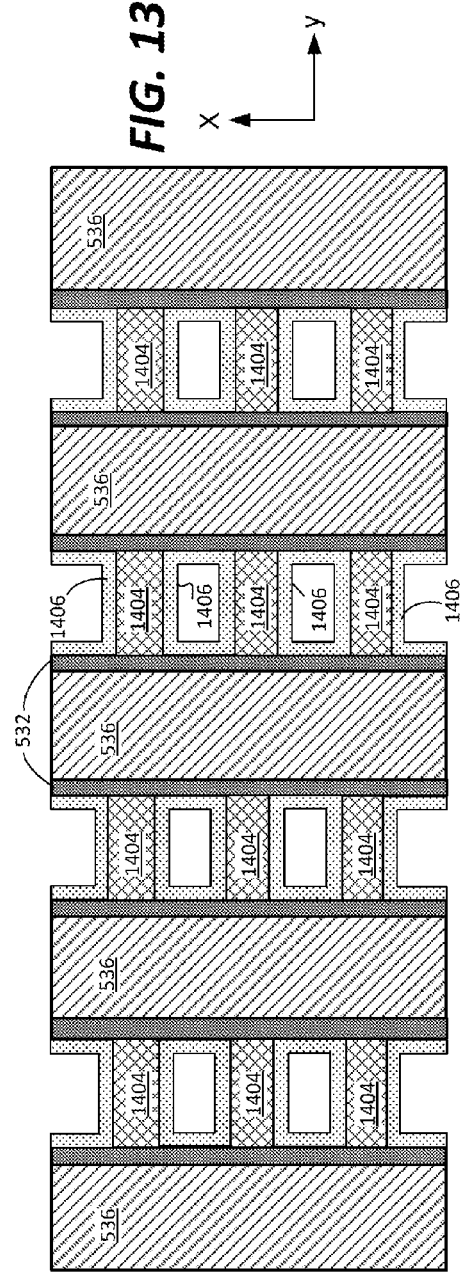
FIG. 13c
FIG. 13d

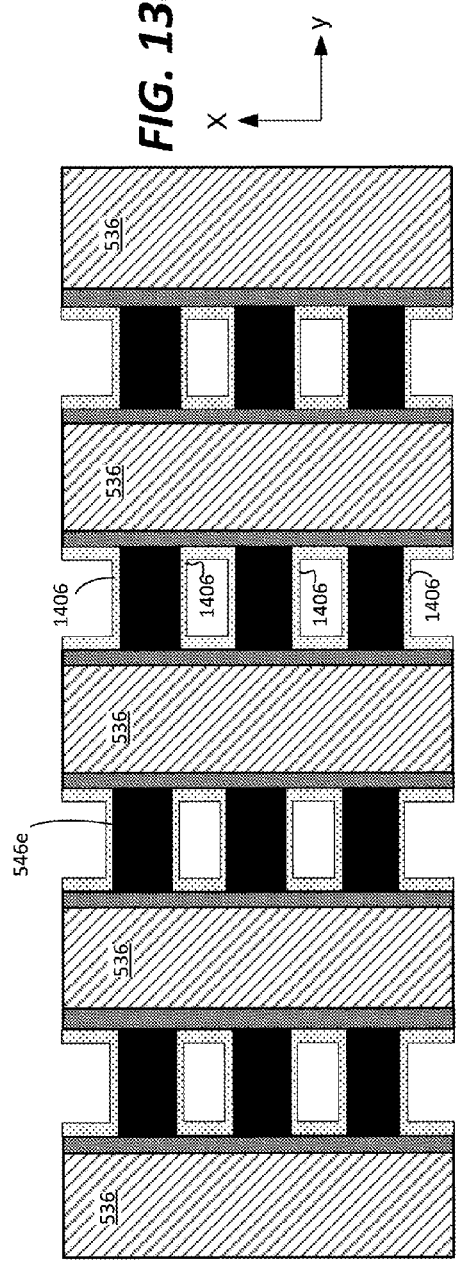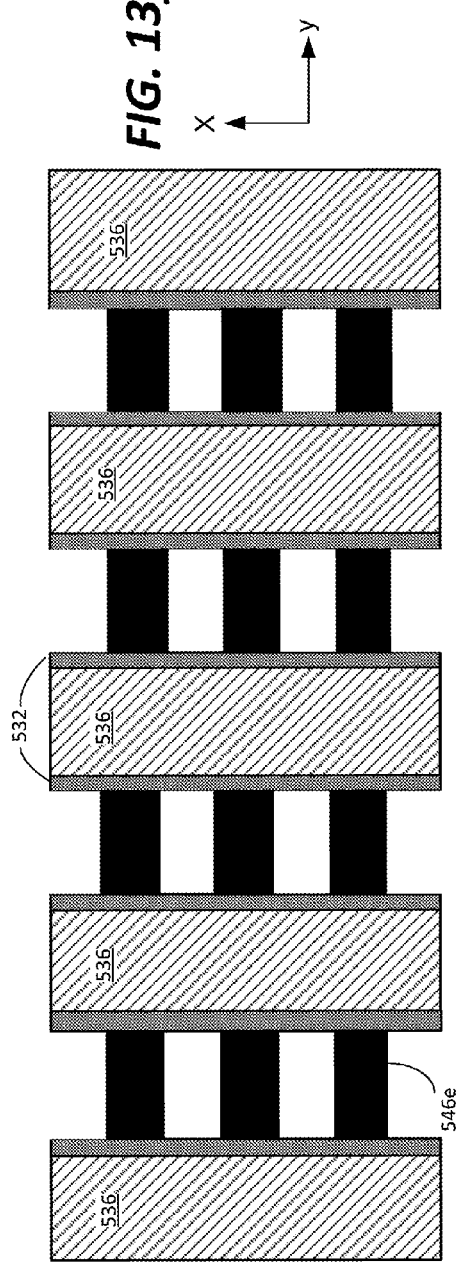

SILICIDED BIT LINE FOR REVERSIBLE-RESISTIVITY MEMORY

BACKGROUND

The present disclosure relates to technology for non-volatile storage.

One example of non-volatile memory uses variable resistance memory elements that may be set to either low or high resistance states. Upon application of sufficient voltage, current, or other stimulus, the variable resistance memory element switches to a stable low-resistance state, which is sometimes referred to as setting the device. This resistivity-switching is reversible such that subsequent application of an appropriate voltage, current, or other stimulus can serve to return the reversible resistivity-switching material to a stable high-resistance state, which is sometimes referred to as resetting the device. This conversion can be repeated many times.

The variable resistance memory elements may be in an undetermined state when first manufactured. This may be referred to as the "virgin state." In the virgin state, the resistance could be higher than for the reset state. The term "forming" may be used to describe putting the variable resistance memory elements into a lower resistance state for the first time. For some memory elements, the forming operation requires a higher voltage than the set and/or reset operations.

3D memory arrays having variable resistance memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the set, reset, or form operation, while others are unselected.

BRIEF DESCRIPTION OF THE DRAWINGS

FIG. 8A is a cross-sectional view of a memory structure including one embodiment of a vertical bit line and the memory structure of FIG. 5.

FIG. 8D is a cross-sectional view of a memory structure including another embodiment of a vertical bit line.

FIG. 8G depicts one embodiment in which each vertical bit line is formed entirely from silicide.

FIGS. 13a-13h depict results according to one embodiment of the process of FIG. 12.

DETAILED DESCRIPTION

Figure 1:
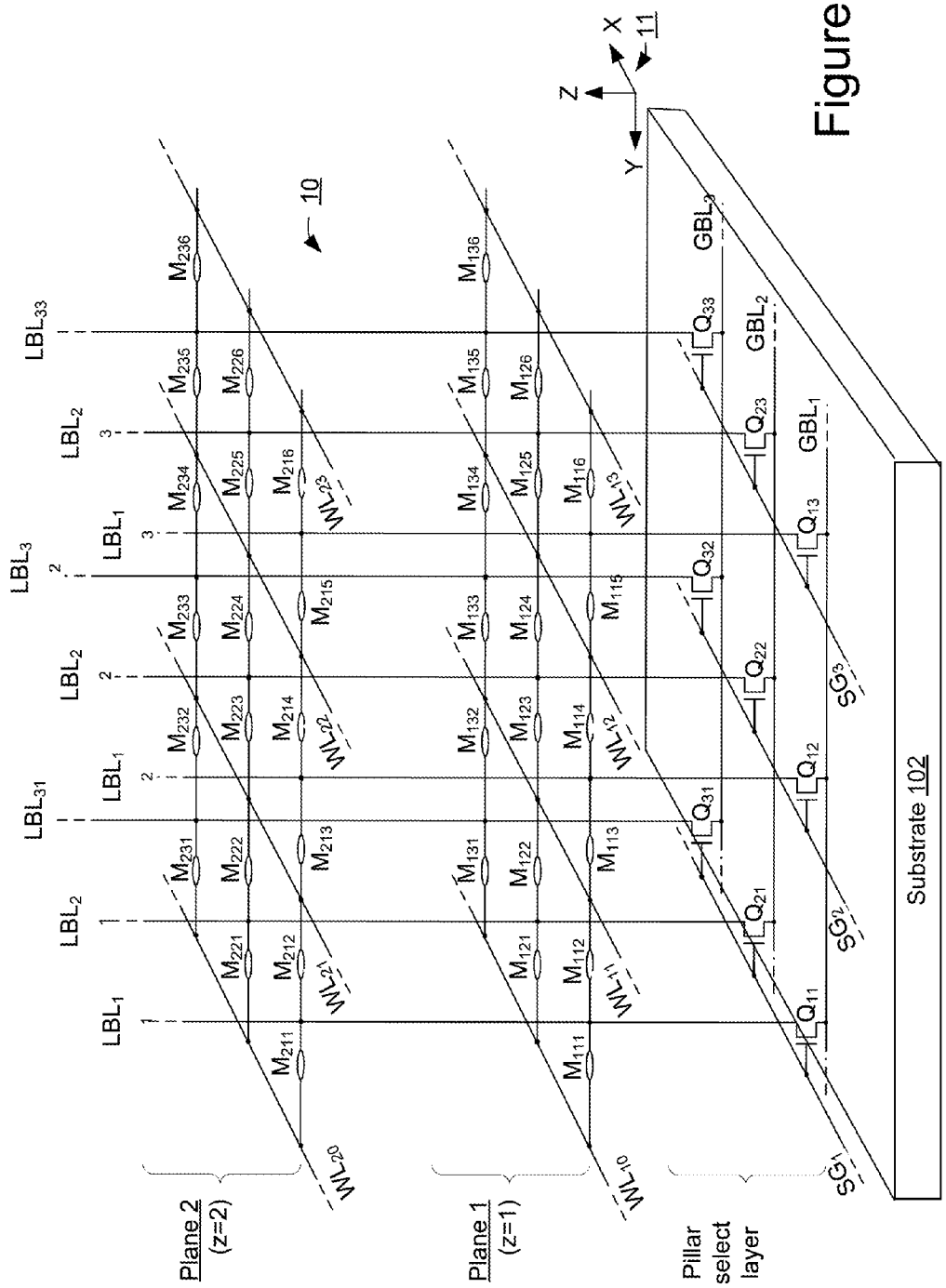
FIG. 1 is an equivalent circuit for a portion of an example three-dimensional array of variable resistance memory elements including a vertical bit line architecture with vertical TFT select devices.

The disclosed technology is directed to memory cells having reversible-resistivity material, as well as the selection lines coupled thereto. The memory cells are in a three-dimensional (3D) non-volatile memory array in some embodiments. The memory cells comprise a reversible-resistivity material, whose resistance level is used to store information. For example, there may be a low resistance state and a high resistance state. In some implementations, there could be more than two resistance states. Thus, more than one bit could be stored per memory cell. The 3D memory array has word lines and bit lines. In one embodiment, the word lines extend horizontally, and local bit lines extend vertically. There may also be a set of global bit lines, as well as selection transistors between the global bit lines and the local vertical bit lines. The reversible-resistivity material of a given memory cell is sandwiched between a word line and a vertical bit line, in one embodiment.

One of the challenges in fabricating such a 3D memory array is fabricating the bit lines. It is possible for the bit line material to oxidize during memory array fabrication. For example, if the reversible-resistivity material is a metal oxide and the bit line material is silicon, then oxygen from the metal oxide can migrate to the silicon, forming silicon oxide. It is possible for a silicon oxide layer to form between the reversible-resistivity material and the bit line. This silicon oxide layer could compromise device operation. For example, operating voltages such as a set voltage, a reset voltage, or a form voltage may need to be increased. Having to increase the form voltage may be especially problematic, since the form voltage is greater than the set or reset voltages, at least for some memory devices. If the form voltage is too great, then it may be greater than the breakdown voltage of a selection transistor connected to the bit line. This breakdown could also be a problem with the set or reset voltage.

Embodiments disclosed herein provide for a 3D memory array and method of fabricating the same that prevents or reduces formation of an oxide layer between the reversible-resistivity material and the bit line. In one embodiment, formation of a silicon oxide layer between a metal oxide reversible-resistivity material and a vertical bit line is prevented. The fabrication technique of one embodiment comprises forming a metal silicide for at least a portion of the bit line. The metal may serve as an oxygen scavenger to draw oxygen away from the silicon, thus preventing formation of silicon oxide. Further details are discussed below.

The metal silicide may also help prevent a depletion layer in silicon in the bit line. For example, a silicon bit line could have a depletion layer during memory array operation. The depletion layer could increase the voltage that is needed during device operations, such as the forming operation. Thus, the metal silicide may decrease operating voltages that are needed by preventing or reducing a depletion layer is the silicon. This can save power, as well as current.

In one embodiment, the three-dimensional (3D) array of memory elements has bit lines that are oriented vertically. That is, instead of stacking a plurality of two-dimensional arrays on a common semiconductor substrate, where each two-dimensional array has its own bit lines, multiple two-dimensional arrays are stacked on top of each other in separate planes but then share common bit lines that extend up through the planes. Memory elements in a 3D memory array may be controlled by applying proper voltages to their vertical bit lines and word lines. By applying either a select voltage or an unselect voltage to the vertical bit lines, while applying either a select voltage or an unselect voltage to the horizontal word lines, memory cells are selected/unselected for operations such as set, reset, and form. A vertical TFT selection device provides the proper voltage to the vertical bit line, in one embodiment.

In FIG. 1, an architecture of a three-dimensional memory 10 is described using a schematic of an equivalent circuit of a portion of the 3D memory. A standard three-dimensional rectangular coordinate is used for reference, the directions of each of vectors x, y and z being orthogonal with the other two. In another embodiment direction x and y are substantially 60 degrees from each other. The array in FIG. 1 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

In other embodiment, more than one vertical TFT select device may be used for a vertical bit line. For example, more than one vertical TFT select device may be stacked upon one another. In another example, one vertical TFT select device may be formed above a vertical bit line and another vertical TFT select device may be formed below the vertical bit line.

Memory elements $M_{zxy}$ are formed in a plurality of planes positioned at different distances in the z-direction above a substrate 102. The substrate 102 has a major surface that extends in what will be referred to herein as a horizontal plane. For example, the x-y plane defines such a major surface. The substrate 102 could be a semiconductor substrate and may be formed from silicon. Various transistors and other semiconductor devices may be formed on or in the substrate 102.

Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three dimensional memory arrays.

The material used for the non-volatile memory elements $M_{zxy}$ in the arrays described herein can be a chalcogenide, a metal oxide, CMO, or any one of a number of materials that exhibit a stable, reversible shift in resistance in response to an external voltage applied to or current passed through the material. Other materials can also be used. The technologies described below are not restricted to any one set of materials for forming the non-volatile memory elements.

By way of example, metal oxides are characterized by being insulating when initially deposited. One suitable metal oxide is a titanium oxide ($TiO_x$). A composite structure can be formed in a non-conductive (high resistance) state. When a large negative voltage (such as 1.5 volt) is applied across the structure, a relatively high current can flow through the structure. The device is then in its low resistance (conductive) state. The conductive path is broken by applying a large positive voltage across the structure. The device returns to its high resistance state. Both of the conductive and non-conductive states are non-volatile. Examples of other oxide materials that can be used for the non-volatile memory elements $M_{zxy}$ in the array include HfOx, ZrOx, WOx, NiOx, CoOx, CoAlOx, MnOx, $ZnMn_2O_4$, ZnOx, TaOx, NbOx, HfSiOx, HfAlOx, or combinations thereof.

Another class of materials suitable for the memory storage elements includes solid electrolytes. They are electrically conductive when deposited. Individual memory elements can be formed and isolated from one another. Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W.

Carbon may also be used as a non-volatile memory element. Carbon is usually used in two forms, conductive (or grapheme like-carbon) and insulating (or amorphous carbon). The operation of a carbon resistive switching nonvolatile memories involves transforming chemical bond configurations by applying appropriate current (or voltage) pulses to the carbon structure. For example, when a very short high amplitude voltage pulse is applied across the material, the conductance is greatly reduced as the carbon may be in an amorphous state. On the other hand, when in the reset state, applying a lower voltage for a longer time causes part of the material to change into the conductive state. Carbon nanotubes (CNTs) may be used as a non-volatile memory material. Such nanotubes can demonstrate very high conductivity. When an electric field is applied across this fabric, the CNT's tend to flex or align themselves such that the conductivity of their fabric is changed.

Yet another class of materials suitable for the memory storage elements is phase-change materials. A group of phase-change materials may include chalcogenide glasses, often of a composition $Ge_xSb_yTe_z$, where x=2, y=2 and z=5. GeSb may also be used. Other materials include AgInSbTe, GeTe, GaSb, BaSbTe, InSbTe and various other combinations of these basic elements. When a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form polycrystal phases of high conductivity.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines can be made of the conductive materials described above. In embodiments using additional conductive segments for at least one of the two memory element electrodes, those segments can be made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where steering elements are included. The diode can be a p-n junction (not necessarily of silicon), a metal/insulator/insulator/metal (MIIM), or a Schottky type metal/semiconductor contact but can alternately be a solid electrolyte element.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC).

Figure 2:
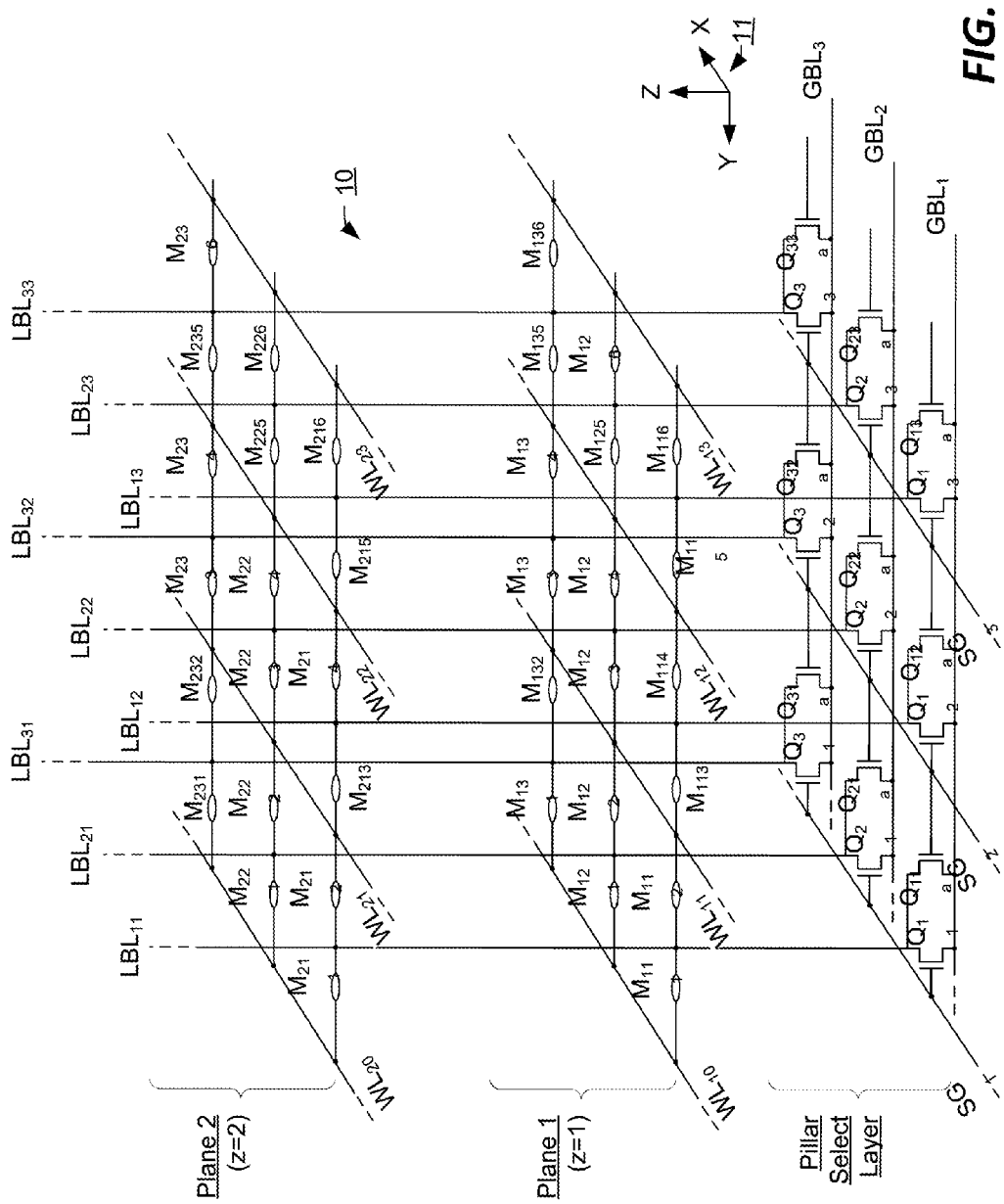
FIG. 2 is an equivalent circuit for a portion of another example three-dimensional array of variable resistance memory elements.

FIG. 2 is a partial schematic of a three-dimensional memory 10 that includes a double-gated structure for the vertically oriented TFT select devices Qxy. Planes 1 and 2 of FIG. 2 are the same as in FIG. 1. As can be seen, each local bit line LBL is connectable to a respective global bit line GBL by two row select signals. FIG. 2 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 2.

Figure 3:
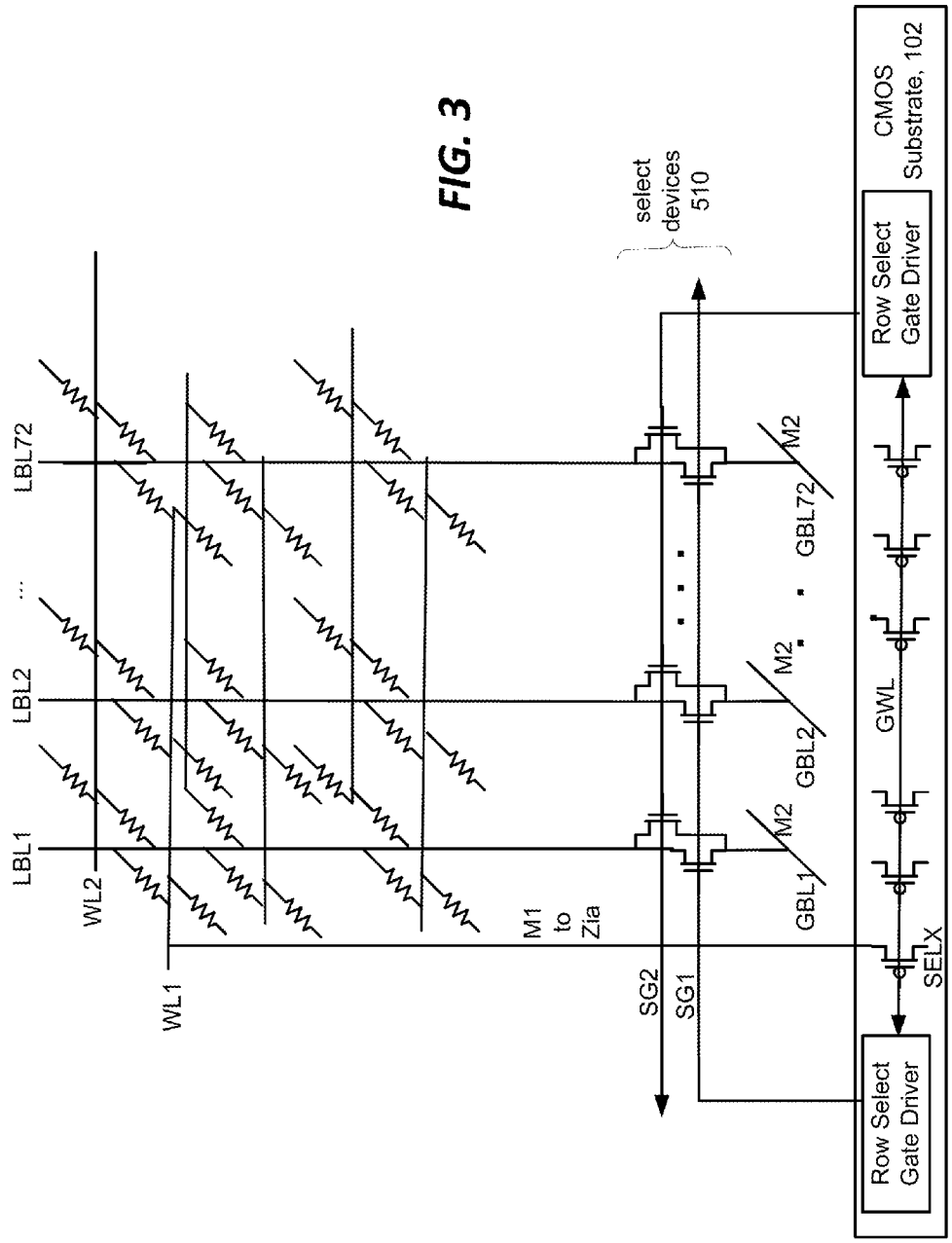
FIG. 3 is a schematic of a portion of a memory system, depicting vertical bit lines, vertically oriented select devices above the substrate and row select line drivers in the substrate.

FIG. 3 shows another partial schematic also depicting the double-gated structure such that the local bit lines (LBL1, LBL2, . . . LBL72) are connected to their respective global bit lines (GBL1, GBL2, . . . GBL72) by any of two respective vertically oriented TFT select devices that are positioned above a CMOS substrate 102. As can be seen, while the double-gated structure includes positioning the various select devices 510 above the substrate 102, the Row Select Line Drivers providing the row select lines $SG_1$, $SG_2$, . . . are positioned in the substrate. Similarly, the global word lines (e.g., GWL) are position in a metal layer on the substrate 102 and below the vertically oriented select devices. Furthermore, the Row Select Line Driver uses the appropriate global word line GWL as an input in one embodiment.

Figure 4:
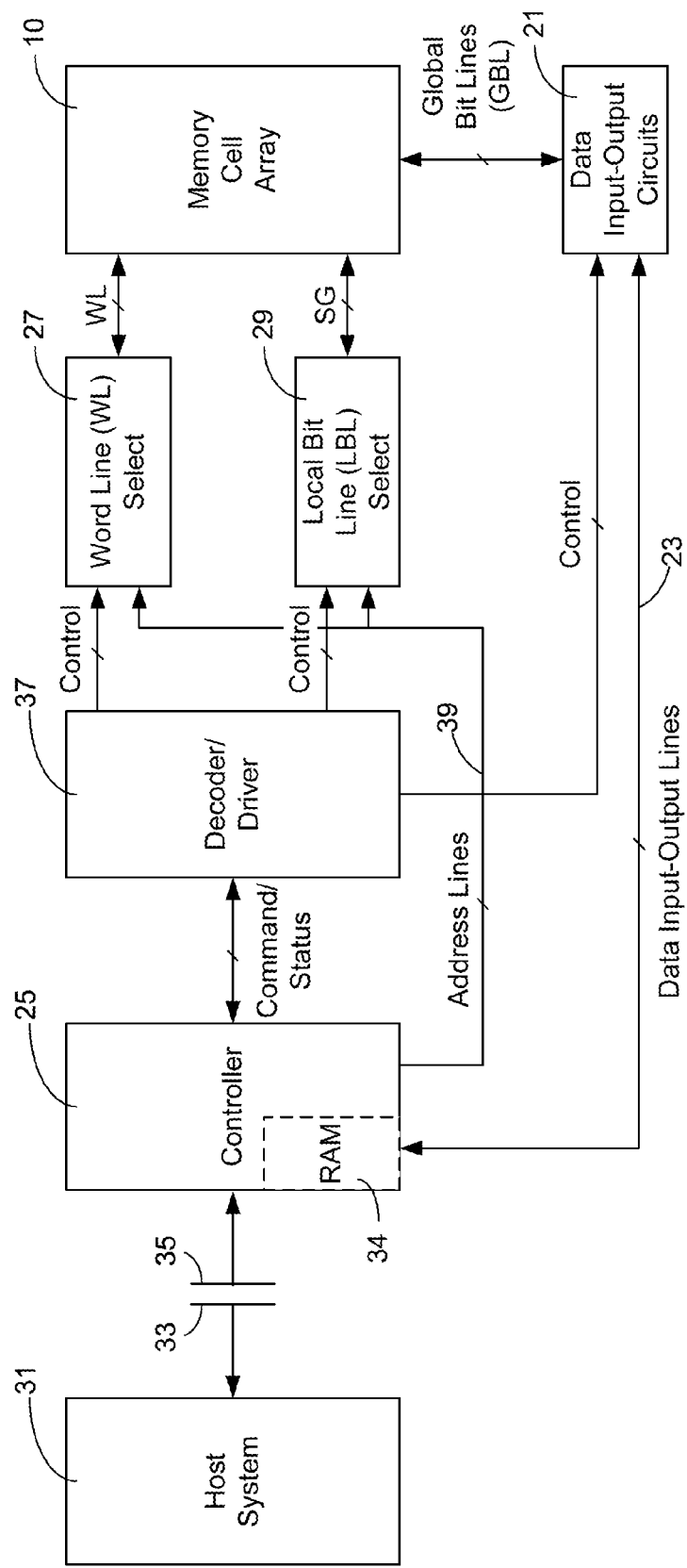
FIG. 4 is a schematic block diagram of a re-programmable non-volatile memory system which can utilize the memory arrays of FIGS. 1-3, and which indicates connection of the memory system with a host system.

FIG. 4 is a block diagram of an illustrative memory system that can use the three-dimensional memory 10 of FIGS. 1-3. Data input-output circuits 21 are connected to provide (during programming) and receive (during reading) analog electrical quantities in parallel over the global bit-lines GBL that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIGS. 1-3, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although each of the memory elements $M_{zxy}$ in the array of FIGS. 1-3 may be individually addressed for changing its state according to incoming data or for reading its existing storage state, it may be preferable to program and read the array in units of multiple memory elements in parallel. One row of memory elements on one plane may be programmed and read in parallel, for example. The number of memory elements operated in parallel depends on the number of memory elements connected to the selected word line. In some arrays, the word lines may be segmented (not shown in FIGS. 1-3) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is may be preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements may be further divided into a plurality of pages of storage elements. The memory elements of a page can be programmed and read together. This is similar to the use of pages in flash memories. The memory elements of an individual page are programmed and read together. When programming, those memory elements that are to store data that are represented by the reset state are not changed from the reset state. Those of the memory elements of a page that need to be changed to another state in order to represent the data being stored in them have their states changed by the programming operation.

Figure 5:
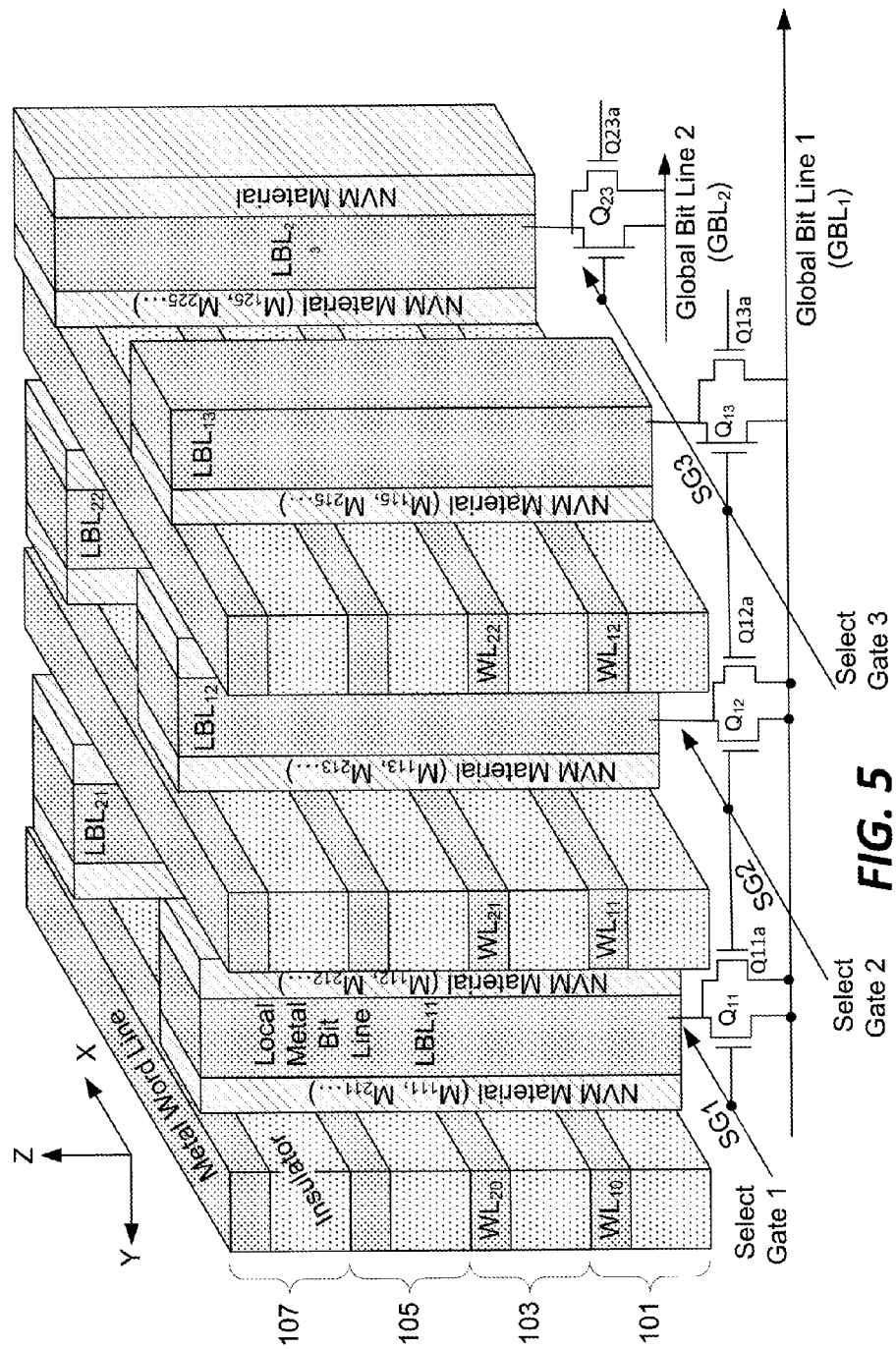
FIG. 5 is an isometric view of a portion of the three-dimensional array shown in FIG. 2 according to one example of an implementation.

One example semiconductor structure for implementing a three-dimensional memory element array of FIG. 2 is illustrated in FIG. 5 which is configured for use of non-volatile memory (NVM) material that is non-conductive when first deposited. A metal oxide can be used for this characteristic in one example. Since the material is initially non-conductive, the memory elements at the cross-points of the word and bit lines are isolated from each other. Several memory elements may be implemented by a single continuous layer of material, which in the case of FIG. 5 are strips of NVM material oriented vertically along opposite sides of the vertical bit lines in the y-direction and extending upwards through all the planes. A significant advantage of the structure of FIG. 5 is that all word lines and strips of insulation under them in a group of planes may be defined simultaneously by use of a single mask, thus greatly simplifying the manufacturing process.

A small part of four planes 101, 103, 105 and 107 of the three-dimensional array are shown. Elements of the FIG. 5 array that correspond to those of the equivalent circuit of FIG. 1 are identified by the same reference numbers. It will be noted that FIG. 5 shows the two planes 1 and 2 of FIG. 3 plus two additional planes on top of them. All of the planes have the same horizontal pattern of conductor, dielectric and NVM material. In each plane, metal word lines (WL) are elongated in the x-direction and spaced apart in the y-direction. The word lines may also be formed of polysilicon or other materials. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) running in the y-direction at the same pitch as the pillar spacing through the vertical TFT select devices ($Q_{xy}$) whose gates are driven by the row select lines (SG) elongated in the x-direction. The vertical TFT select devices have a channel extension, in one embodiment.

Not shown in FIG. 5 are sense amplifiers, input-output (I/O) circuitry, control circuitry, and other peripheral circuitry. There is one row select line (SG) for each row of local bit line pillars in the x-direction and two vertical TFT select device (Q) for each individual vertical local bit line (LBL).

Each vertical strip of NVM material is sandwiched between the vertical local bit lines (LBL) and a plurality of word lines (WL) vertically stacked in all the planes. The NVM material may be present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes Hafnium Oxide, the word lines comprise TiN, and the bit lines comprise a silicide. In one embodiment, the NVM material includes Hafnium Oxide, the word lines comprise TiN, and the bit lines comprise polycrystalline silicon and a silicide.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element does not conduct a significant amount of current. Similarly, in other embodiments, the non-conducting NVM material may be left in place between adjacent local bit lines if the operating voltages between the adjacent LBLs remain below the programming threshold. The NVM material may also be left in place if the spacing between the LBLs is larger than the NVM thickness in the cell.

To enable the memory to be denser (e.g., more memory elements per area), the size of the memory elements can be made small and the memory elements can be arranged close to each. To enable the memory elements to be close to each other, one embodiment uses a vertically oriented TFT decoder for connecting the individual local vertical bit line pillars to the respective global bit lines. In one embodiment, each vertically oriented TFT select device is a pillar select device that is formed as a vertical structure, switching between a local bit line pillar and a global bit line. The vertical TFT select devices, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented TFT select devices above, but not in, the substrate allows the memory elements to be arranged in a more compact fashion, thereby increasing density. Additionally, positioning the vertically oriented TFT select devices above the substrate allows for other devices (e.g., the word line drivers) to be positioned in the substrate under the memory array rather than outside of the array, which allows the integrated circuit to be smaller.

For example, a pillar shaped vertical Thin Film Transistor (TFT) can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 6:
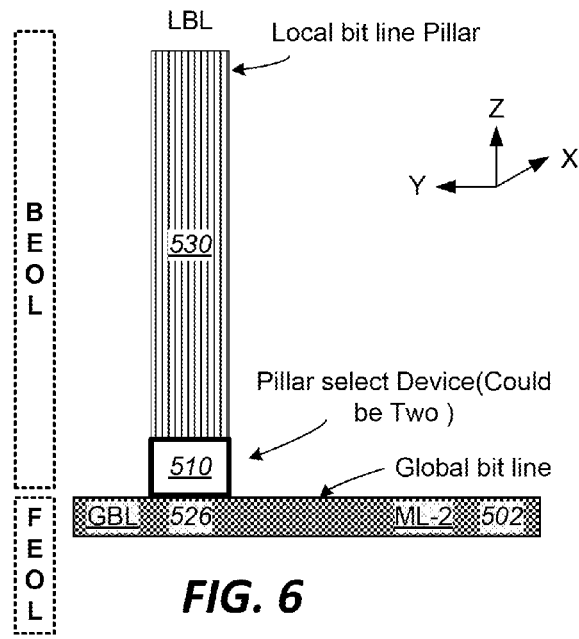
FIG. 6 is a plan view that depicts a vertical bit line, a vertically oriented select device and a global bit line.

FIG. 6 illustrates the structure of a vertically oriented TFT select device in relation to the local bit line and the global bit line. The 3D memory 10 is formed on top of a CMOS substrate (not shown explicitly) where structures in the CMOS are referred to as being in the FEOL ("Front End of Lines"). The vertically oriented TFT select devices switch individual vertical bit lines (that are above and not in the substrate) to individual global bit lines that are formed on top of the FEOL layer in the BEOL ("Back End of Lines"). Thus, the BEOL includes the pillar select layer with the memory layer on top of it. The vertically oriented TFT select devices (such as $Q_{11}$, $Q_{12}$, . . . , $Q_{21}$, $Q_{22}$, . . . , etc.) are formed in the pillar select layer as vertically oriented TFT select devices. The pillar select layer is formed above (and not in) the substrate. The vertically oriented TFT select device may switch a local bit line to a global bit line. In the example, the local bit line LBL 530 is switchable to the global bit line GBL 526 by a vertically oriented TFT select transistor 504 such as $Q_{11}$. The gate of the TFT select transistor $Q_{11}$ is controllable by a signal exerted on a row select line $SG_1$ (not shown).

The global bit line such as GBL 526 is formed below the vertically oriented TFT select device, in the FEOL as part of the metal layer-1 or metal layer-2 502. The vertically oriented TFT select device is formed in the BEOL layer on top of the GBL 526 (and above, but not in, the substrate). The local bit line LBL 530, in the form of a pillar, is formed on top of the vertically oriented select device 504. In this way, the vertically oriented TFT select device 504 can switch the local bit line pillar LBL to the global bit line GBL.

Figure 7:
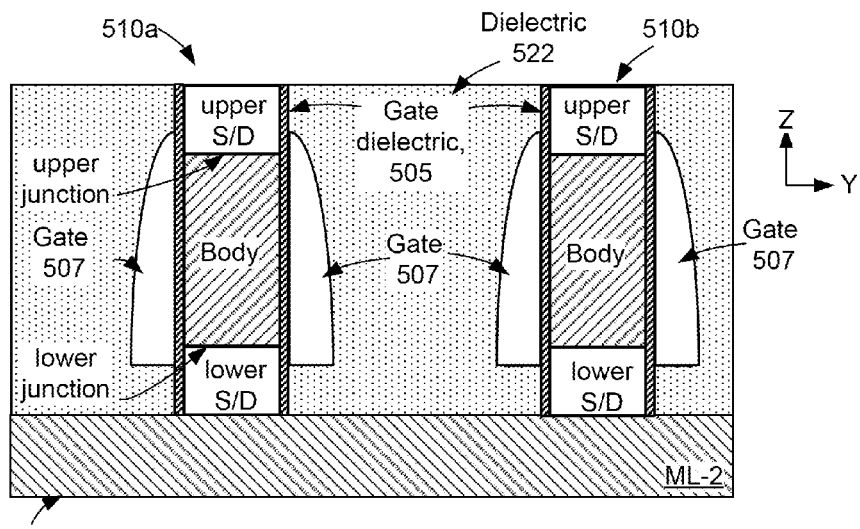
FIG. 7 depicts the structure of two vertical TFT selection devices in accordance with one embodiment.

FIG. 7 depicts an example of a vertical TFT selection device that can be used with embodiments of the disclosure. Two vertical TFT selection devices 510a and 510b are illustrated which may be used for selecting vertically oriented bit lines (not shown). Each vertical TFT selection device 510a, 510b has two source/drain (S/D) regions. The term "source/drain" is used because the region could function as either a source or a drain, depending on the voltages that are applied to the TFT. The source/drain regions are on either side of the body. The source/drain regions and body are polysilicon in one embodiment.

In some embodiments, the body and the S/D regions are of opposite conductivity. For example, the body may be p– and each S/D N+. As another example, the body may be n– and each S/D P+. Thus, the TFT could be an enhancement NFET (N+ p– N+) or enhancement PFET (P+n–P+), as two examples. In some embodiments, the body and the S/D regions have the same conductivity. For example, the body may be p– and each S/D P+. As another example, the body may be n– and each S/D N+. Thus, the TFT could be a depletion type N+ n– N+ (NFET) or depletion type P+ p– P+ (PFET), as two examples. For depletion type devices, N+ n– N+ (NFET) and P+ p– P+ (PFET), the level of conductivity of each S/D may be much higher than that of the body. In one embodiment, the S/D net doping concentration is 3-4 orders of magnitude greater than the body net doping concentration.

Each of the vertical TFT selection devices 510a, 510b may have two gates 507 and a dielectric material 505 separating each gate from the body and S/D regions. This dielectric may be referred to as a gate dielectric as it separates gates 507 from the body and S/D regions. In one embodiment, the gate dielectric 505 extends along the sides of the source/drain regions and the body or each selection device. The gate dielectric can be elongated in the x-direction along the vertical sidewalls of the pillar structure including the body and S/D regions. In other examples, the TFT selection devices may share gates (e.g., between two adjacent selection devices). Additionally, gate-all-around configurations may be used.

The gate dielectric separates the gates from either the body or the source/drain regions, as the case may be. In this example, each gate 507 extends vertically from below the lower junction to above the upper junction. That is, the gates 507 are formed directly adjacent to the vertical extent of the body and directly adjacent to a portion of the vertical extent of both S/D regions. The lower source/drain is connected to a global bit line in this embodiment. The upper source/drain can be connected to a vertically oriented bit line (not depicted in FIG. 7).

Note that the vertical bit line material may serve as one of the electrodes of read-write memory elements. In some embodiments, the material of the vertical BL comprises N+ polycrystalline silicon (also referred to as "poly"). Note that the vertical BL may also comprise a silicide. For some types of memory cells, N+ poly serves as a good electrode choice (on the BL side) to achieve desired operation of a specific memory cell and memory array. For other memory cells with different material composition, P+ poly may be chosen as an electrode (on the BL side) for desired operation of the memory cell and array. The P+ polysilicon work function is different from N+ polysilicon, and may be more suitable for the electrode material to enable the most efficient memory cell operation. In this latter case, a PFET TFT selection device may be preferable due to its source/drain being P+ (thus matching the vertical bit line). Accordingly, reference to the global bit line 526 or vertical bit line may include reference to such electrodes included with other bit line material such as metals. For example, global bit line 526 may refer to a metal global bit line alone, a semiconductor global bit line along, or a combination of the two materials, such as an N+ or P+ material overlying a metal line.

A gap fill dielectric 522 such as an oxide is formed between adjacent select devices as an insulating material. Under each gate 507, the gap fill dielectric 522 extends vertically from a lower surface or endpoint region of each gate 507 to an upper surface of the global bit line 526. In another example, the gate dielectric 505 may be formed over the global BL 526 such that the gap fill dielectric 522 extends from an upper surface of the gate dielectric to a lower surface of each gate.

Between adjacent gates 507, dielectric 522 extends vertically from an upper surface of global BL 526 (or gate dielectric 505) to at least the level of the upper surface of the upper source/drain region. Dielectric 522 can be formed in a single process step to both fill the area or void beneath each gate, as well as to fill the areas between adjacent gates. In another example, the gates may sit or overlie a dielectric base that is formed separately from the dielectric 522. In such an example, the gate dielectric may overlie the separately formed base or be formed beneath it. In yet another example, the gate dielectric can be formed along the upper surface of the global bit line and the lower surface of the gate 507 may contact the gate dielectric directly such that no additional dielectric material such as 522 is formed therebetween.

FIG. 8A is a cross-sectional view of a memory structure using a vertically oriented TFT select device 504 as shown in FIG. 7 with the memory structure of FIG. 5. FIG. 8A shows ten gates 507 in a gate material layer, each underneath a stack of multiple word lines. As can be seen, two gates are positioned between pairs of vertically oriented select devices 504, above and not in the substrate. Each select device includes two gates, one on each side formed along a vertical sidewall of the pillar structure. The gates 507 extend horizontally in the x-direction (not shown) and can form row select lines $SG_x$ as shown in FIGS. 1-5.

The memory layer includes a set of vertical bit lines 530. Interspersed between the vertical bit lines 530 are alternating layers of insulating lines 534 (e.g., oxide) and layers of word lines 536. In one embodiment, the word lines are made from TiN. Between the vertical bit lines 530 and the stacks of alternating oxide lines 536 and word lines 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. In this example, the word line and the bit line may serve as two electrodes of the memory element. The memory elements are positioned above, and not in, the substrate.

Directly below each vertical bit line 530 is one of the vertically oriented TFT select devices 510, each of which comprises (in one example embodiment) an n+/p–/n+ TFT. Each n+ region may be referred to as a source/drain. The p– region may be referred to as a body. The p– region may serve as the channel of the TFT during operation. As noted above, other conductivities can be used in the TFT selection device, with suitable changes to other elements in the memory array.

Each of the vertically oriented TFT select devices 504 includes a gate dielectric 505 on each side. The dielectric 505 is oxide in one embodiment. In this embodiment, each TFT has two gates. There is a gate 507 to the left and a gate 507 to the right of the TFT body. The gate dielectric extends horizontally between adjacent select devices over the upper surface of the underlying global bit line 526 in this example.

Note that in other embodiments, the select devices are not vertically oriented TFTs. The select device may be a transistor other than a "thin film transistor". The select device is not required to be vertically oriented. By vertically oriented, it is meant that stack of the source 504/body 506/drain 508 are in the z-direction, as depicted in FIG. 8A. In one embodiment, the source/body/drain form a stack in the y-direction instead. The foregoing applies to other examples herein such as FIGS. 8D and 8G.

The memory structure of FIG. 8A is a continuous mesh array of memory elements because there are memory elements connected to both sides of the bit lines and memory elements connected to both sides of the word lines. At the bottom of FIG. 8A, the CMOS substrate is depicted. Implemented on the top surface of the CMOS structure are various metal lines including ML-0, ML-1, and ML-2. Line 526 of ML-2 serves as a respective global bit line (GBL). The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 507 can be polysilicon, Titanium Nitride, Tantalum Nitride, Nickel Silicide or any other suitable material. Gate material 507 implements the row select lines $SG_x$ (e.g. $SG_1$, $SG_2$, . . . of FIG. 1), which are labeled in FIG. 8A as gates 507. Portions of the row select lines may also be referred to a transistor gates. In one embodiment, an N+ line overlies metal ML-2 serving as part of the global bit line.

Figure 8B:
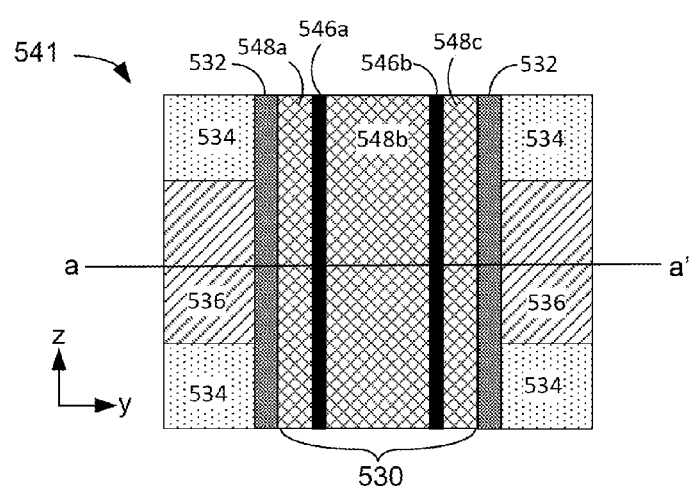
FIG. 8B shows a close up view of box 541 from FIG. 8A.
Figure 8C:
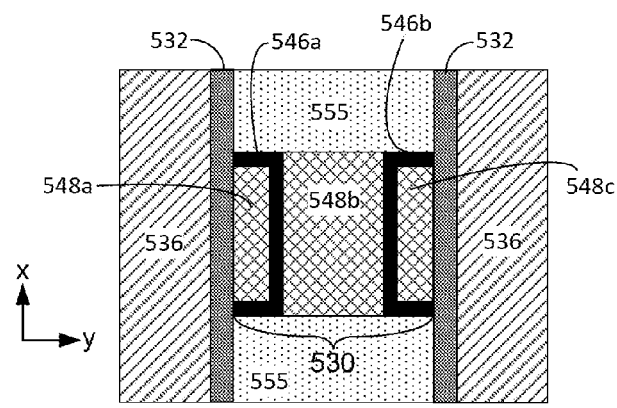
FIG. 8C depicts a cross-section along line a-a' in FIG. 8B.

In the embodiment of FIG. 8A, each vertical bit line 530 comprises a polysilicon (also referred to as "polycrystalline silicon") region 548a, silicide region 546a, polysilicon region 548b, silicide region 546b, and polysilicon region 548c. FIG. 8B shows a close up view of box 541 from FIG. 8A. FIG. 8C depicts a cross-section along line a-a' in FIG. 8B.

Thus, in the foregoing embodiment, the order of the memory cell stack in the y-direction is: word line/reversible resistivity material/polysilicon/silicide/polysilicon/silicide/polysilicon/reversible resistivity material/word line. Note that this example includes two memory cells. That is, each region of reversible resistivity material 532 is part of a different memory cell. The word line 536 adjacent to the reversible resistivity material 532 may serve as one memory cell electrode, and the portion of the bit line 530 adjacent to the reversible resistivity material 532 may serve as the other memory cell electrode.

In one embodiment, the word line 536 is TiN and the reversible resistivity material 532 is a metal oxide (e.g., hafnium oxide). In this case, the order of the memory cell stack in the y-direction is TiN/metal oxide/polysilicon/silicide/polysilicon/silicide/polysilicon/metal oxide/TiN. The silicide in any of these examples for FIGS. 8A-8C may be a metal silicide such as cobalt silicide or nickel silicide, as two examples.

Figure 8E:
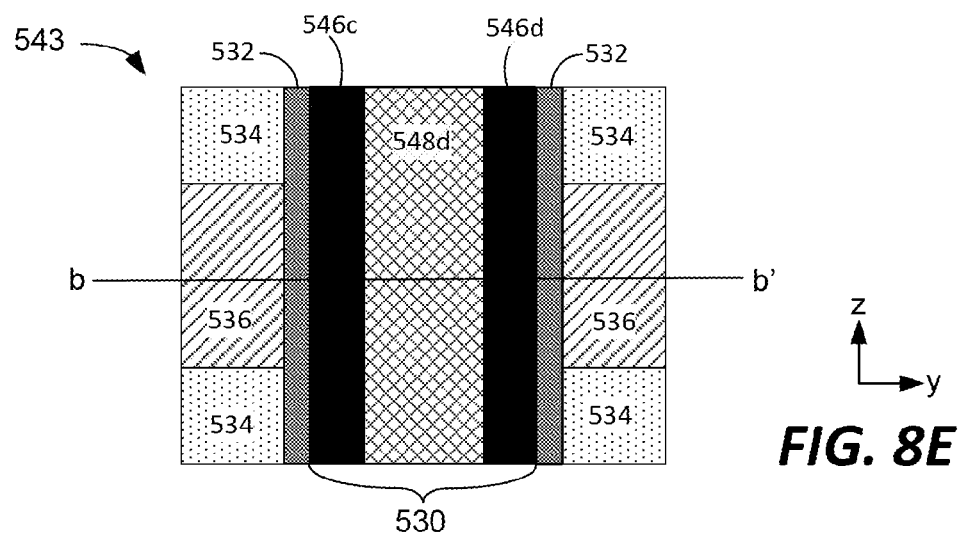
FIG. 8E shows a close up view of box 543 in FIG. 8D.
Figure 8F:
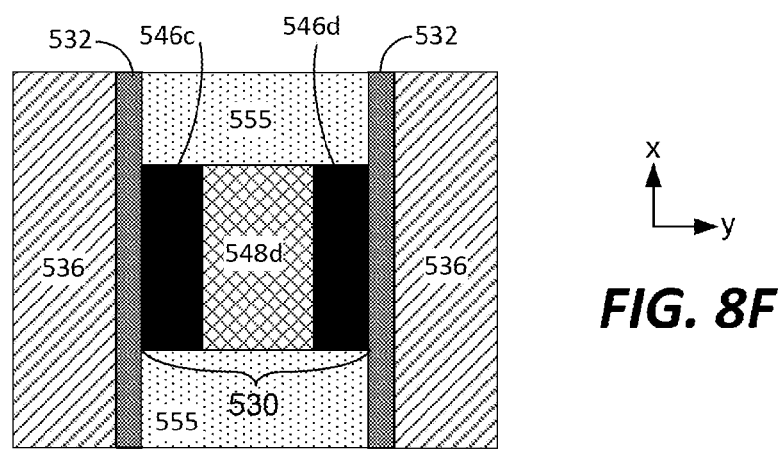
FIG. 8F depicts a cross-section along line b-b' in FIG. 8E.

FIGS. 8D-8F depict another embodiment in which each vertical bit line 530 comprises silicide region 546c, polysilicon region 548b, and silicide region 546d. FIG. 8E shows a close up view of box 543 in FIG. 8D. FIG. 8F depicts a cross-section along line b-b' in FIG. 8E. Thus, in the foregoing embodiment, the order of the memory cell stack in the y-direction is: word line/reversible resistivity material/silicide/polysilicon/silicide/reversible resistivity material/word line. In one embodiment, the word line 536 is TiN and the reversible resistivity material 532 is a metal oxide. In this case, the order of the memory cell stack in the y-direction is TiN/metal oxide/silicide/polysilicon/silicide/metal oxide/TiN. The silicide in any of these examples for FIGS. 8D-8F may be a metal silicide such as cobalt silicide or nickel silicide, as two examples.

Figure 8H:
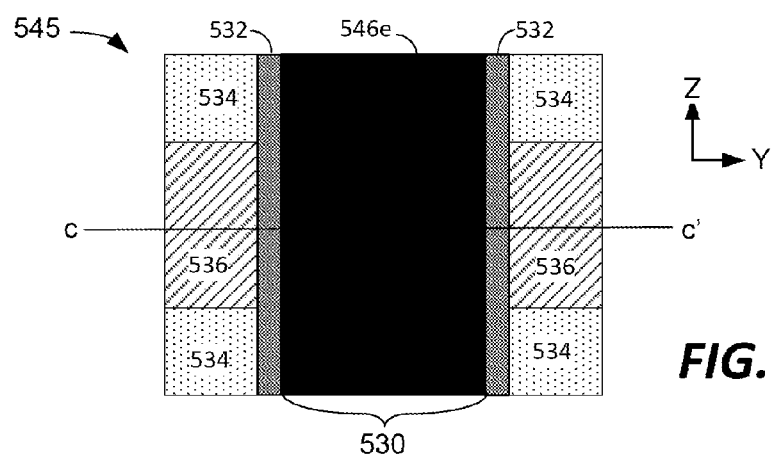
FIG. 8H shows a close up view of box 545 in FIG. 8G.
Figure 8I:
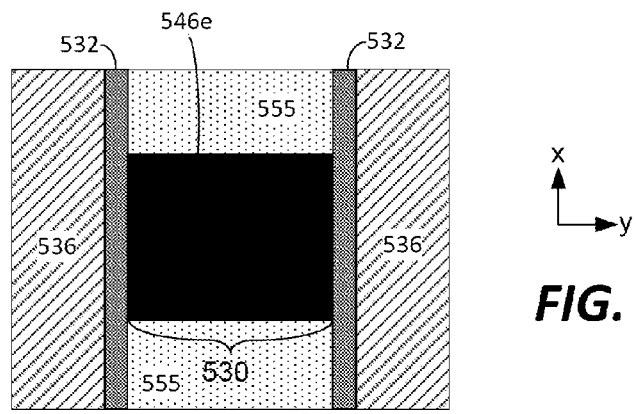
FIG. 8I depicts a cross-section along line c-c' in FIG. 8H.

FIGS. 8G-8I depict another embodiment in which each vertical bit line 530 is formed entirely from silicide (see silicide region 546e in FIGS. 8H and 8I). FIG. 8H shows a close up view of box 545 in FIG. 8G. FIG. 8I depicts a cross-section along line c-c' in FIG. 8H. Note that in FIG. 8G, all of the bit line 830 may be formed from a silicide. Thus, in the foregoing embodiment, the order of the memory cell stack in the y-direction is: word line/reversible resistivity material/silicide/reversible resistivity material/word line. In one embodiment, the word line 536 is TiN and the reversible resistivity material 532 is a metal oxide. In this case, the order of the memory cell stack in the y-direction is: TiN/metal oxide/silicide/metal oxide/TiN. The silicide in any of these examples for FIGS. 8G-8I may be a metal silicide, such as cobalt silicide or nickel silicide, as two examples.

Figure 8J:
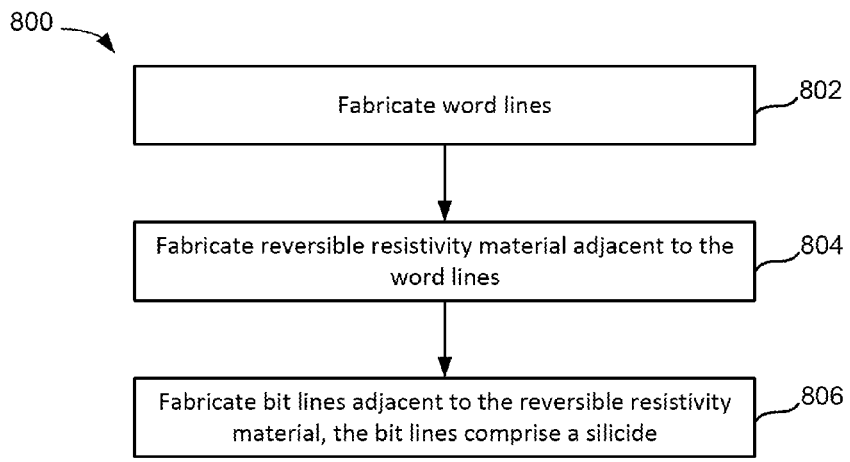
FIG. 8J is a flow chart describing a process of fabricating a three-dimensional memory array in accordance with one embodiment.

FIG. 8J is a flow chart describing a process 800 of fabricating a three-dimensional memory array in accordance with one embodiment. This process may prevent or reduce the formation of silicon oxide between reversible resistivity material (such as metal oxide) of the memory cell and the bit line. The process can be used when forming memory cells including, but not limited to, the examples of FIGS. 8A-8I.

In step 802, word lines are formed. In one embodiment, the word lines are formed from TiN.

In step 804, reversible resistivity material is formed adjacent to the word lines. In one embodiment, the reversible resistivity material is a metal oxide. In one embodiment, the metal oxide is hafnium oxide. However, the reversible resistivity material is not limited be being a metal oxide. In one embodiment, the reversible resistivity material is a conductive bridge type material (cells made with such material may be referred to as a programmable metallization cell (PMC)). PMC is based on the physical re-location of ions within a solid electrolyte. In one embodiment, the reversible resistivity material is a vacancy-modulated conductive oxide (VMCO) resistive material.

In step 806, bit lines are formed adjacent to the reversible resistivity material. The bit lines comprise a silicide. In one embodiment, the bit lines comprise a metal silicide. The metal silicide may include, but is not limited to, cobalt silicide and nickel silicide.

Thus, in one embodiment, process 800 forms a memory cell having a TiN electrode, a metal oxide region for storing information, and another electrode that comprises a silicide. This other electrode may include both polycrystalline silicon and the silicide.

Figure 8K:
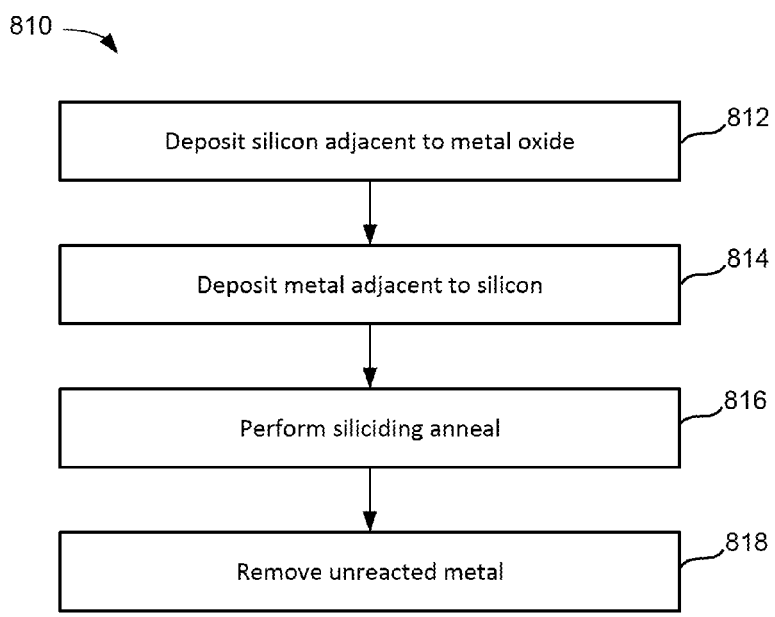
FIG. 8K is a flow chart describing a process of forming a bit line having a silicide region in accordance with one embodiment.

FIG. 8K is a flow chart describing a process 810 of forming a bit line having a silicide region in accordance with one embodiment. This process may prevent or reduce the formation of silicon oxide between metal oxide of the memory cell and the bit line. The process can be used when forming memory cells including, but not limited to, the examples of FIGS. 8A-8I. The process is one embodiment of step 806 from process 800. Note the metal oxide for the memory cells is formed prior to process 810.

In step 812, silicon is deposited adjacent to the metal oxide. This is amorphous silicon, in one embodiment. The silicon may be doped in situ. For example, the silicon could be doped with an n-type impurity. Note that the silicon may have a greater Gibbs free energy than the metal oxide. An implication of this is that the silicon could possible deprive oxygen from the metal oxide. This could potentially form a silicon oxide layer between the metal oxide and the silicon. In one embodiment, the silicon is about 10 nanometers or less in thickness. Keeping the silicon as a thin layer can assist in allowing oxygen to be extracted during step 816, described below.

In step 814, metal is deposited adjacent to the silicon. The metal may be deposited by sputtering. The metal is a "silicide forming" metal in one embodiment. For example, the metal is capable of forming a silicide with silicon. The metal may have a greater Gibbs free energy than the silicon. Thus, the metal is an oxygen scavenging material, in one embodiment. In one embodiment, the metal is cobalt. In one embodiment, the metal is nickel. However, other metals that have a greater Gibbs free energy than silicon may be used.

In step 816, a siliciding anneal is performed. During the siliciding anneal, the metal that was deposited in step 814 may extract oxygen that may be present in the silicon. As noted, it is possible that oxygen from the metal oxide can migrate to the silicon. Thus, the metal can extract this oxygen from the silicon. This can prevent, or at least reduce, the formation of silicon oxide.

In step 818, unreacted metal is removed. Note that in some cases all of the metal that was deposited in step 814 could react with the silicon to form a silicide. Thus, step 818 might not be needed in all cases.

Process 800 and/or process 810 can be used when fabricating a 3D memory array having variable resistance memory cells. In one embodiment, the bit lines are local vertical bit lines. However, process 800 and process 810 are not limited to an architecture having local vertical bit lines.

Figure 9:
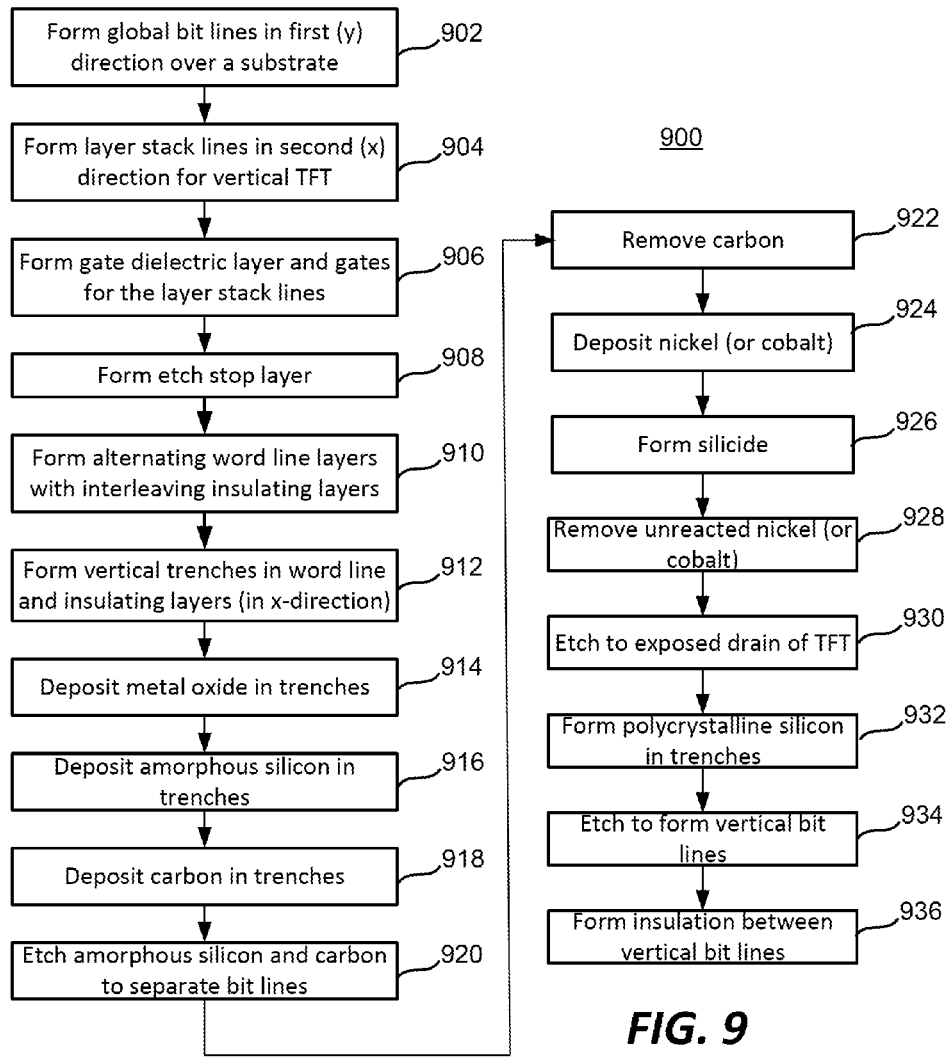
FIG. 9 is a flow chart describing a process of fabricating a three-dimensional memory array in accordance with one embodiment.
Figure 10H:
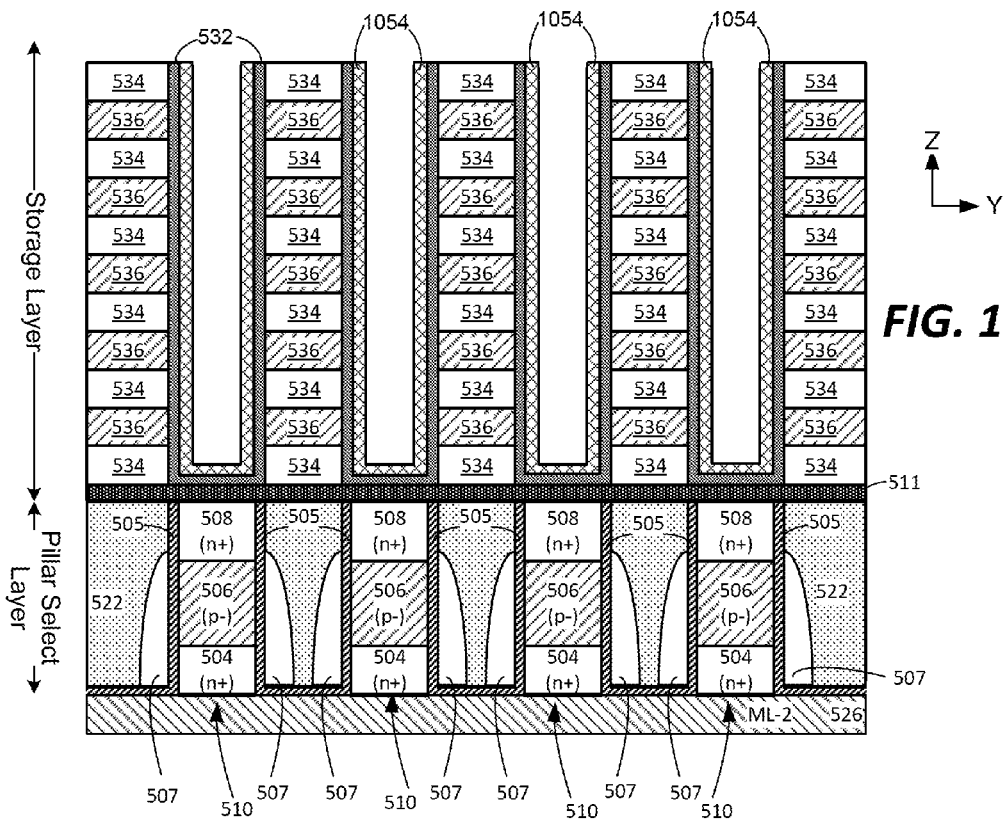
FIGS. 10a-10t are perspective and cross-sectional views of a memory structure that can be fabricated according to the process of FIG. 9.
Figure 10I:
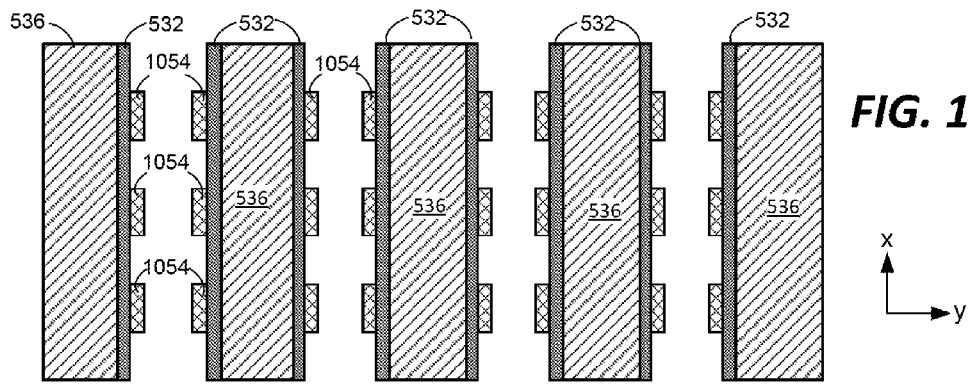
Figure 10J:
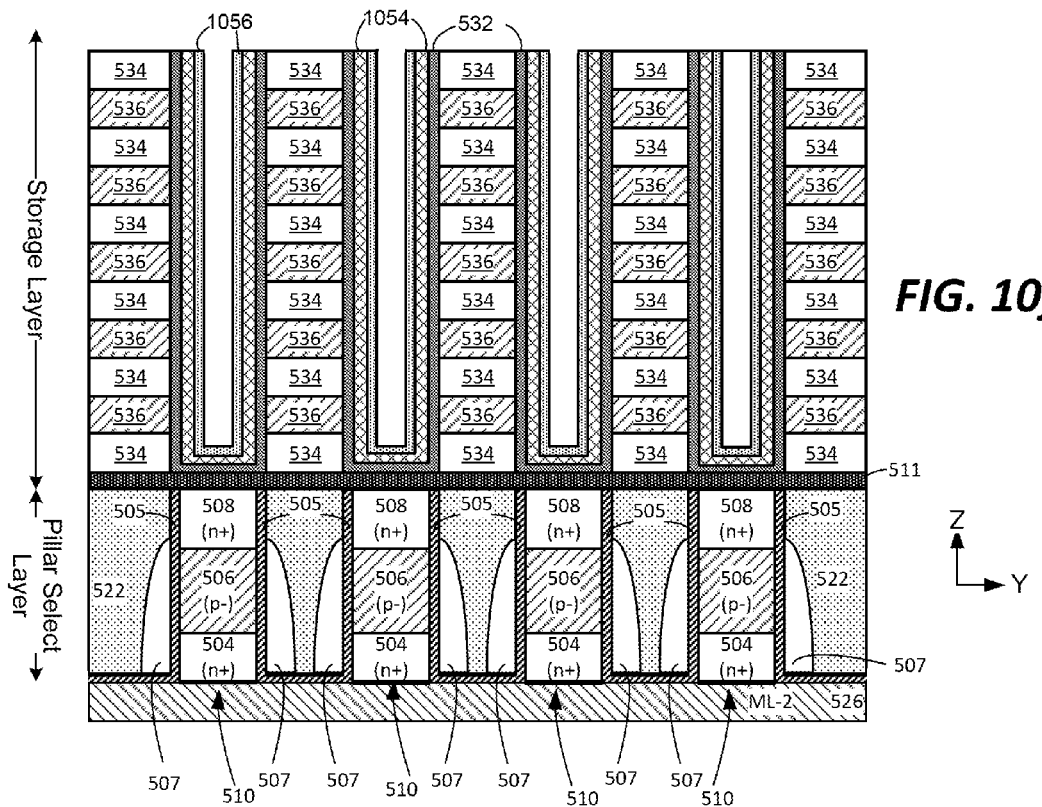
Figure 10K:
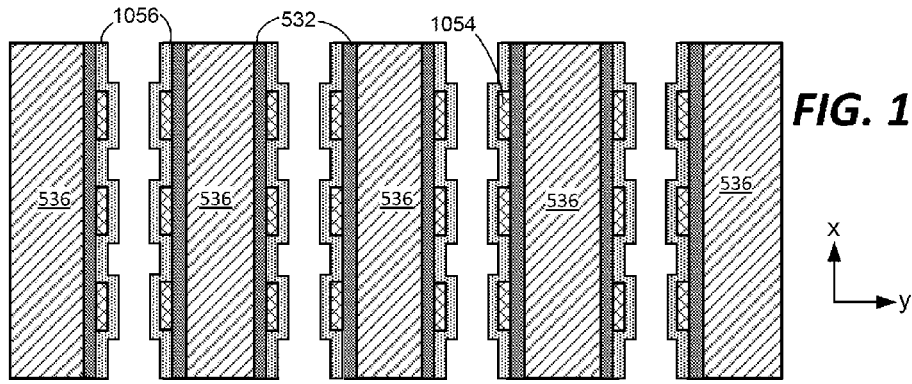
Figure 10L:
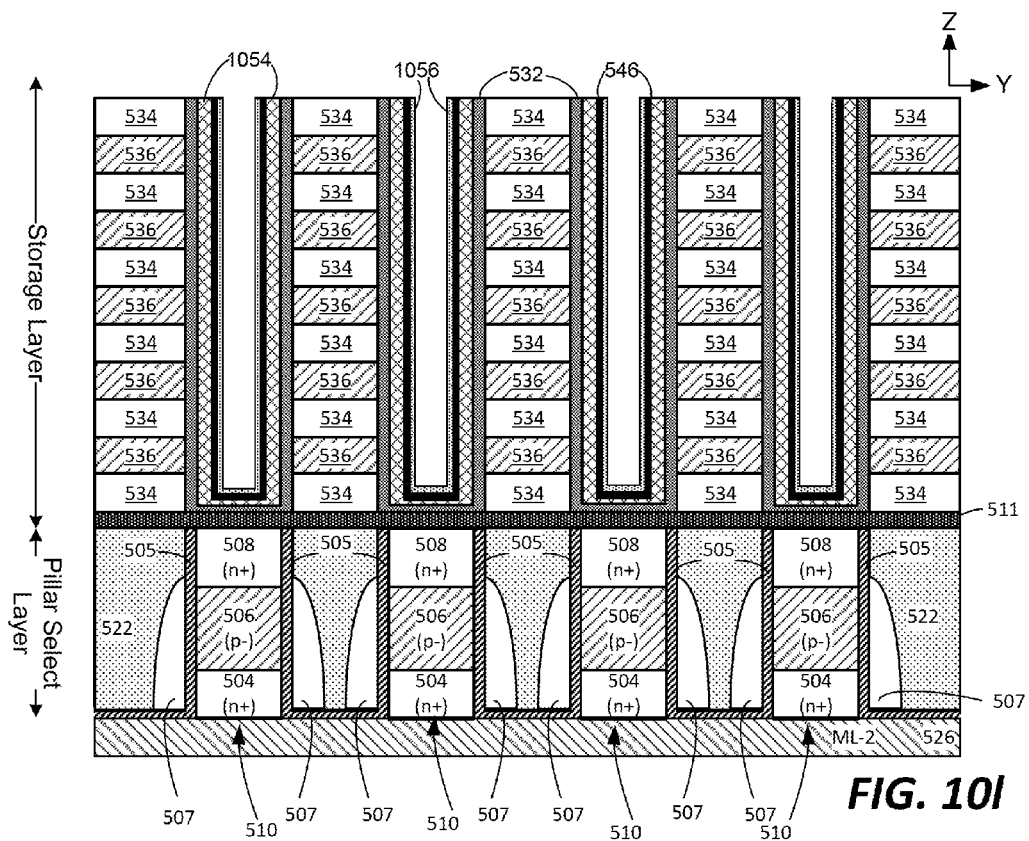
Figure 10M:
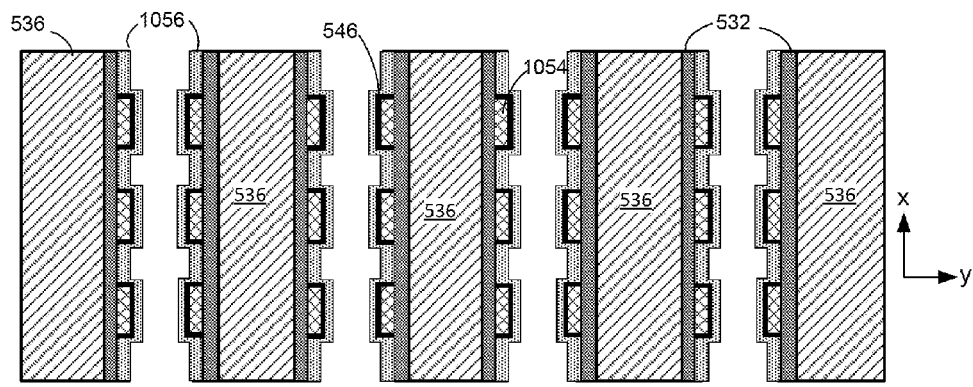
Figure 10N:
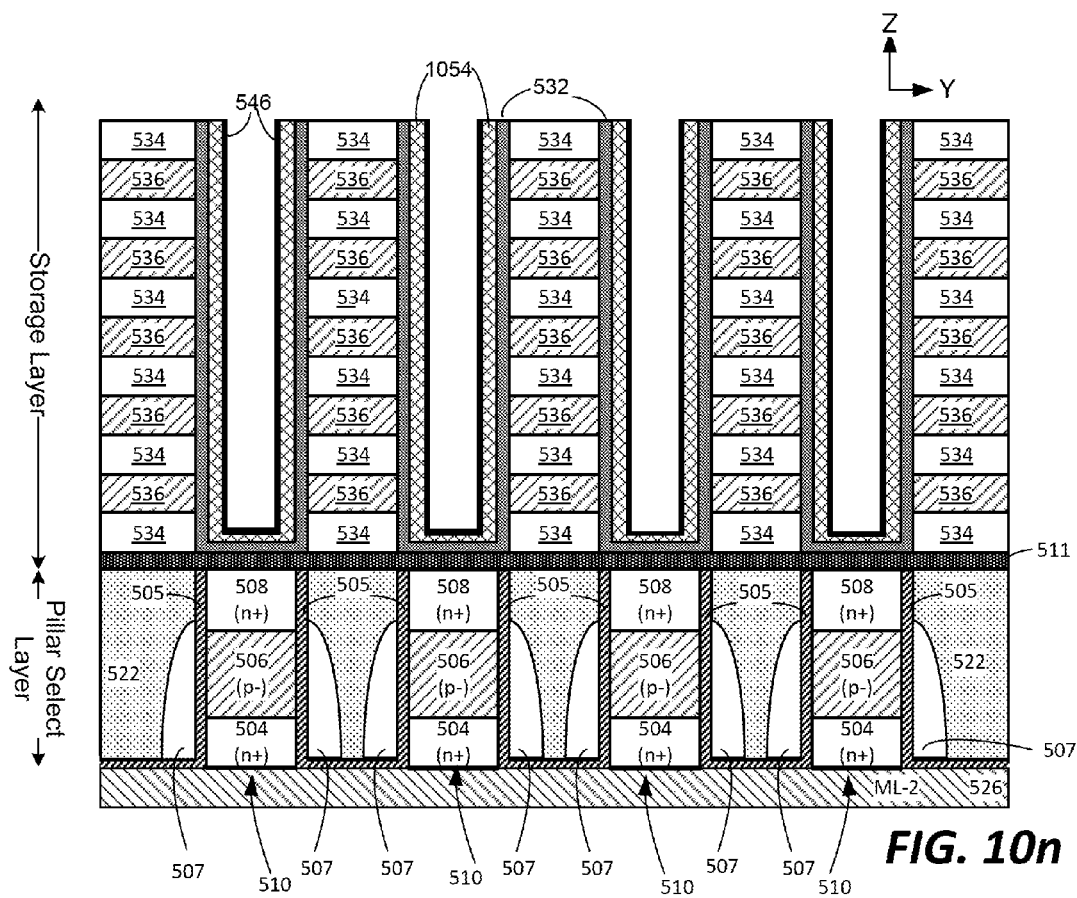
Figure 10O:
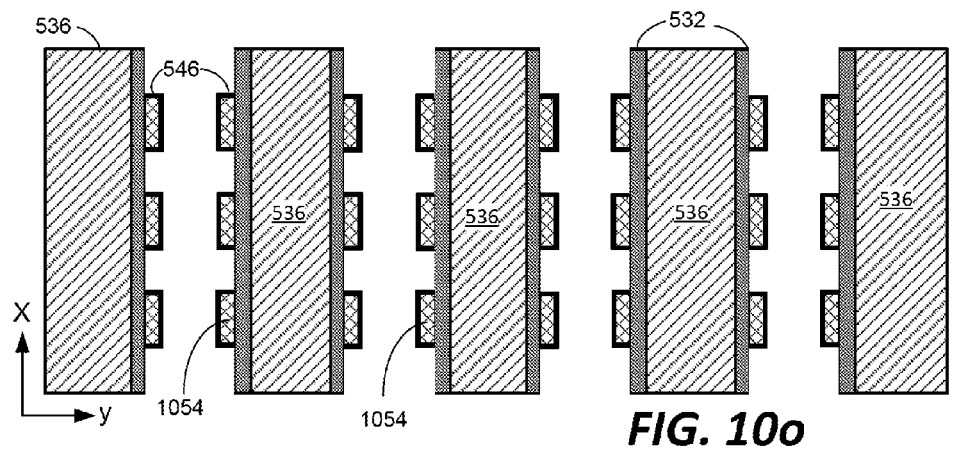
Figure 10Q:
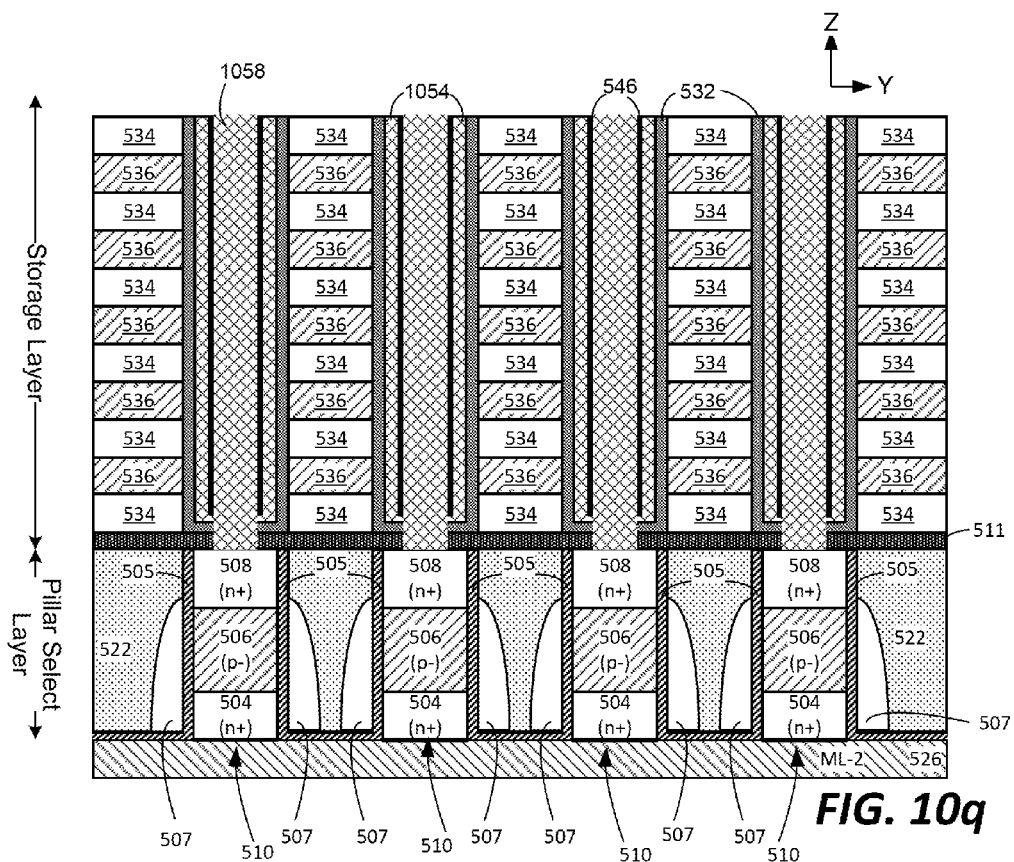
Figure 10R:
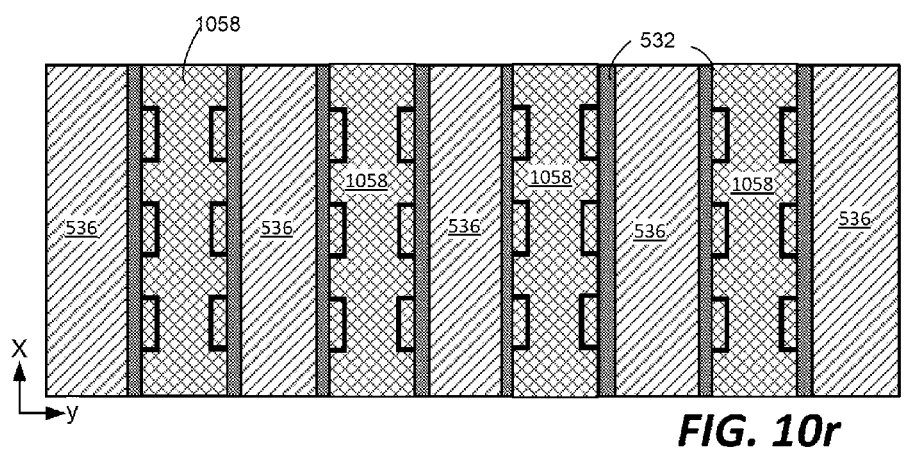
Figure 10S:
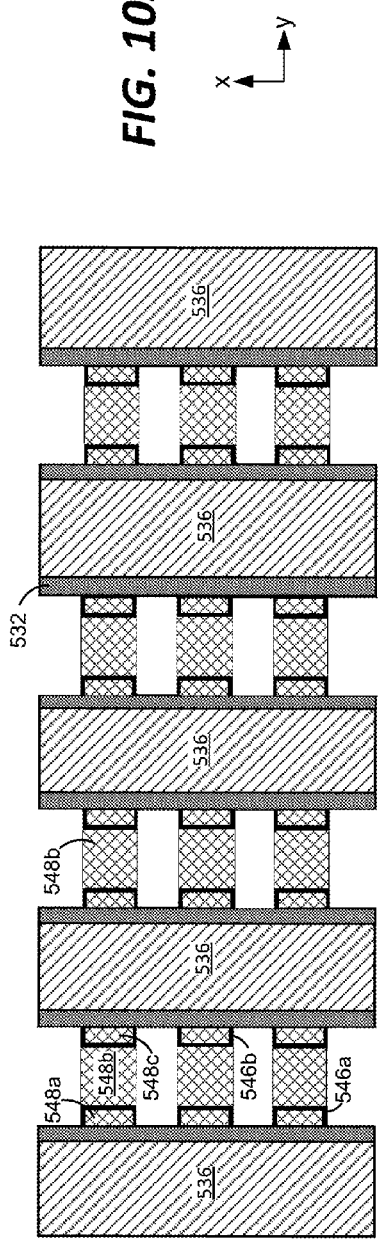
Figure 10T:
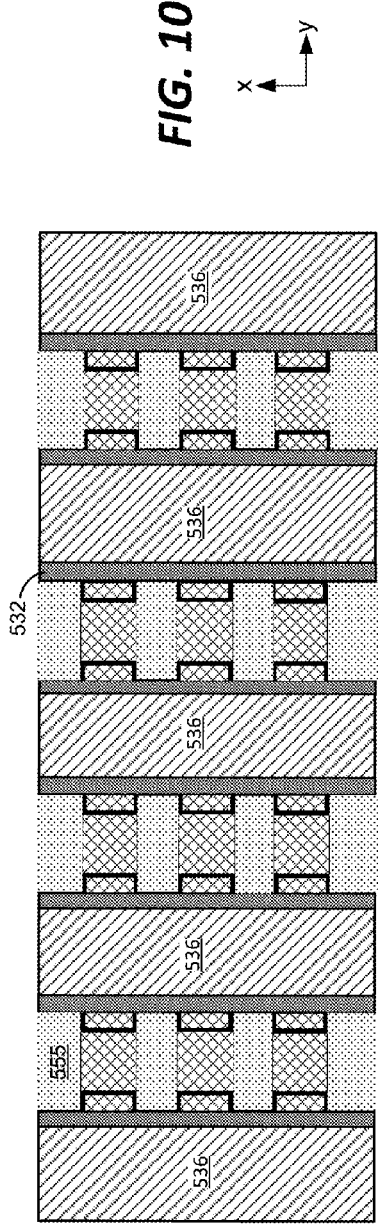

FIG. 9 is a flow chart describing a process 900 of fabricating a three-dimensional memory array in accordance with one embodiment. This process may prevent or reduce the formation of silicon oxide between metal oxide of the memory cell and the bit line. The process in FIG. 9 can be performed after manufacturing metal layers and substrate layers (e.g., drivers and other logic). For example, the process of FIG. 9 can follow zero ML-0 and first ML-1 metal layer manufacturing processes. In one example, the process may be preceded by forming a base oxide (e.g., 900 nm). FIGS. 10a-10t are perspective and cross-sectional views of a memory structure that can be fabricated according to process 900. FIGS. 10a and 10b show formation of the pillar select layer. FIGS. 10c, 10d, 10h, 10j, 10l, 10n, 10p, and 10q are y-z views of the memory array, during various stages of formation. FIGS. 10f, 10g, 10i, 10k, 10m, 10o, 10r, 10s, and 10t are x-y cross-sectional views of one of the word line levels of the memory array, during various stages of formation. Note that in these drawings, at times not all similar elements are labeled with reference numerals so as to not obscure the drawings.

At step 902, global bit lines are formed that are elongated in a column direction over the previously formed layers and the substrate. At step 904, layer stack lines for a pillar select layer are formed over the global bit lines. The substrate layers and one or more metal layers can be manufactured, followed by forming the select gate layer stack lines for the pillar select structure. The metal layers can include a metal layer (e.g., metal layer ML-2) that is patterned and formed into the global bit lines.

FIG. 10a is a perspective view depicting the results of step 902 and 904 in one embodiment. Four layer stack lines 580 (also called layer stack rows), each containing two select gates (SG) or select device pillars 582 are shown. It is noted that a typical memory will include many more pillar select lines and within each pillar select line, many more select device pillars. The layer stack lines are elongated in the row or x-direction, orthogonal to the global bit lines which extend in the column or y-direction. The global bit lines may include one or more metal layers such as a layer of tungsten (W) (e.g., 150 nm) between two layers of titanium nitride (TiN) (e.g., 20-100 nm) in one example. Additional layers such as an n+ polysilicon layer may be included in the global bit lines, overlying the metal ML-2 material. The global bit lines are separated by an insulating layer 521 formed from an oxide or other dielectric material. Each pillar is separated from adjacent pillars in the same line by insulating material 521. In another example, the insulating material between bit lines and the insulating material between select gate pillars may be different.

Each select gate pillar includes several lower n+ regions (e.g., 30 nm) forming the lower S/D region 504 for the select device, several p− regions (e.g., 120 nm) forming the body 506, and several upper n+ regions (e.g., 50 nm) forming the upper S/D region 508. Only two of each of the regions are depicted per pillar. However, there may be many more such regions. Thus, there may be many more select transistors per pillar. Note that the upper S/D region may operate as a drain and the lower S/D region as a source, in one example. In other example, the upper S/D region may operate as a source and the lower S/D region as a drain. As described above, different configurations and materials may be used to form the body and S/D regions.

In one embodiment, there is a conductive hard mask region (not depicted in FIG. 10a) at the top of the pillars that can be used to form a contact to the overlying vertical bit line, for example. The conductive hard mask may include metals or doped polysilicon, for example. In one example, the hard mask material is a metal such as tungsten and/or TiN that serves as a mask and also enables contact to the vertical bit lines. Furthermore, the metal hard mask may provide a suitable etch stop for forming trenches in which the vertical bit lines are formed. These regions are optional and are not included in other embodiments.

At step 908, a gate dielectric layer and gates for the select transistors are formed. FIG. 10b is a cross-sectional view along a line in the y-direction through a column of select devices depicting the results of step 908 in one embodiment. The gate dielectric layer 505 layer extends along the vertical sidewalls (elongated in the x-direction) of each select transistor pillar. In one example, gate dielectric layer 505 is an oxide such as silicon oxide or hafnium oxide formed by atomic layer deposition (ALD). In another example, gate dielectric layer 505 is a thermally grown oxide. Conformal deposition can be used to form a dielectric layer between approximately 3 and 10 nanometers in thickness in one example. In FIG. 12b, the gate dielectric extends over the global bit line between adjacent select gate pillars. For example, the gate dielectric 505 is an $SiO_2$ gate oxide formed using atomic layer deposition to a thickness of about 5 nm in one example. Such a gate oxide can provide adequate isolation between the gates and global bit lines in one embodiment.

A gate layer is formed and etched back to form gates that extend vertically along the vertical sidewalls of the layer stack lines. Etching back the gate material removes horizontal portions of the gate material to leave sidewall spacers. Each sidewall spacer forms one gate 507. The gates 507 are separated from the pillar stack lines by the gate dielectric 505. In this example, gates 507 may be referred to as spacer gates 507 due to their formation by conformal deposition and etch back as associated with spacer-formation processes. Any suitable etch back process may be used. In the x-direction, the gates extend along each layer stack row to form gates for each select device formed in the line. In the vertical or z-direction, the upper surface of the gates may extend beyond the upper S/D junction between the p− body region and the upper n+ S/D region. The gates extend vertically toward the substrate, having a lower surface that extends beyond the lower S/D junction between the p− body region and the lower n+ S/D region. The gate bottom height refers to the vertical distance between the lower surface of the gate and the upper surface of the global bit line. The gate bottom height is controlled by the ALD process for the gate dielectric deposition in one example. This can provide precise control to position the bottom of the gate relative to the lower pn junction. In one example, the gate is formed by depositing 90 nm of TiN, and etching back 135 nm to leave the spacers. Polysilicon or other materials may also be used.

FIG. 10b also depicts the formation of a gap fill dielectric 522. A gap fill dielectric 522 is formed, planarized, and then etched back to expose the upper surface of each layer stack line. Chemical mechanical polishing (CMP) may be used for the planarization. If CMP is used, a separate etch back may not be used in one embodiment. In FIG. 10b, etching back exposes the upper surface of the hard mask regions 512. In one example, the gap fill dielectric is a high density plasma (HDP) oxide, deposited to a thickness of 300 nm, planarized by CMP, then etched back 150 nm to expose the upper surface of the hard mask regions. In another example, the etch back may expose the upper surface of S/D regions 508. The gap fill dielectric 522 fills the spaces between adjacent layer stack lines. The gap fill dielectric 522 is an oxide formed using a flowable CVD gap fill technology scheme in one example. Polysilazane-based spin-on-glass techniques may also be used.

Any number of techniques may be used to form the select gate pillars, gates, and gate dielectric. FIGS. 10a-10b depict a gate-last approach where layer stack columns for the select devices are patterned and etched (not shown) first, overlying and parallel to the global bit lines. After a gap fill, the layer stack rows 580 are patterned and etched, forming the select device pillars. After defining the rows, the gate dielectric and gate layers are formed elongated in the row direction, providing horizontal separation between the gates and bodies. Optionally, dielectric bases may be formed, before or after forming the gate dielectric. In another approach a gate-first process can be used to form layer stack rows that are first patterned and etched, orthogonally over the underlying set of global bit lines that are elongated in the column direction. The gate dielectric and gates are then formed, followed by patterning and etching layer stack columns, forming pillars of the select device layers. Each pillar includes a body, an upper source/drain region, and a lower source/drain region. Additional regions such as contact and insulating regions may be formed over the upper source/drain region. Additional regions such as an electrode may be formed under the lower source/drain region.

At step 908, an etch stop layer is formed. The etch stop layer is an insulating material in one example. For example, insulating oxides, nitrides, or combinations of these or other materials may be used.

At step 910, alternating word line and insulating layers are formed over the layer stack lines and the etch stop layer as part of the memory layer. FIG. 10c depicts the results of step 910 in one embodiment. The metal layers and CMOS layer depictions have been removed from FIG. 10c for conciseness and clarity of presentation. In FIG. 10c, the memory layer is formed after etching back or polishing the oxide fill material 522. The memory layer includes alternating oxide layers 1034 and word line layers 1036 in this example. Etch stop layer 511 is depicted between the pillar select layer and the alternating oxide layers 1034 and word line layers 1036. The word lines are interleaved between two oxide insulating layers. In one embodiment, the word lines are made from TiN. In one example, the TiN has a vertical thickness of 10 nm and the oxide has a vertical thickness of 7 nm but other dimensions may be used.

At step 912, trenches or channels are etched in the storage layer. One or more hard mask layers can be patterned to form lines in the x-direction that cover the storage layer at positions between the layer stack lines. Using the hard mask, the storage layer can be etched to form a trench having a bottom that exposes the upper surface of each layer stack line. FIG. 10d depicts the results of step 912 in one embodiment. Note that much of the labeling of the pillar select layer is removed for clarity of presentation. Trenches 529 are etched in the storage layer, through the word line and insulating layers to expose the upper surface of the etch stop layer 511. The layer stack lines 1029 have two vertical sidewalls formed by the vertical sidewalls of the word lines 536 and the insulating lines 534. The layer stack lines 1029 are shown with vertical sidewalls that extend in a perfectly orthogonal direction vertical to the global bit lines. In many cases, the trench etching process will result in vertical sidewalls that intersect the upper surface of the vertical TFT select devices at a more than ninety degree angle. The trenches may be larger at the top and narrower at the bottom closer to the select device, forming a taper as the trench proceeds vertically down toward the pillar select layer.

At step 914, reversible resistivity material is deposited over the layer stack lines 1029 and into the trenches. A conformal deposition process can be used to form the reversible resistivity material along the exposed vertical surfaces of the layer stack lines 1029. The reversible resistivity material is a metal oxide in one embodiment. A resistance change material such as $HfO_2$ can be formed in one example, although any of the earlier-described materials may be used. Reversible resistivity material 532 is conformally deposited to cover exposed surfaces including the vertical sidewalls of word lines 536 and the vertical sidewalls of insulating lines 534.

At step 916, amorphous silicon is deposited into the trenches. This is a conformal layer over the reversible resistivity material, in one embodiment. The amorphous silicon covers vertical sidewalls of the reversible resistivity material. At step 918, carbon is deposited into the trenches. The carbon may fill remaining portions of the trenches.

FIGS. 10e and 10f depict the results of step 918 in one embodiment. FIG. 10f is a cross sectional view along line d-d' in FIG. 10e. Reversible resistivity material (also referred to as "memory layer") 532 is formed conformally along the exposed surfaces of the layer stack lines 1029. The memory layer 532 coats the exposed surfaces of the insulating lines 534 and word lines 536. Memory layer 532 extends vertically along the vertical sidewalls of the insulating lines within the trenches. Memory layer 532 also extends vertically along the vertical sidewalls of the word lines within recesses 552. Additionally, the memory layer 532 extends horizontally along the bottom of the trench. In this example, the memory layer 532 extends horizontally on a portion of the etch stop layer 511. The memory layer does not completely fill the trenches. Accordingly, the trenches are reduced in size, both horizontally and vertically, but the trench remains between the adjacent insulating lines.

A film of amorphous silicon 1048 is depicted in the trenches over vertical sidewalls of the reversible resistivity material 532. The amorphous silicon 1048 also covers the reversible resistivity material 532 at the bottom of the trenches.

Carbon 1050 fills the remaining portions of the trenches. Thus, the carbon is depicted in the trenches over vertical sidewalls of the amorphous silicon 1048. The carbon 1050 also covers the amorphous silicon 1048 at the bottom of the trenches.

At step 920, the carbon and the amorphous silicon are etched in pattern to create bit line to bit line separation. This etching removes portions of the amorphous silicon along the x-axis. Etching may be performed based on a mask pattern. The etch may be an anisotropic dry etch for realizing the high taper angle shape. This etch may use the mixed gas BRr and $Cl_2$. The mask may use an oxide file (e.g. dTEOS). FIG. 10g depicts results after step 920. The etching removes portions of the carbon and the amorphous silicon in the trenches. The etching may go all the way down to the etch stop layer (not depicted in FIG. 10g). At this point the amorphous silicon has the shape of strips 1054 that may extend in the z-direction from roughly the top to the bottom of the trenches. The carbon 1052 may also have the shape of strips that extend in the z-direction from roughly the top to the bottom of the trenches. Note that the x-y cross section depicted in FIG. 10g does not show the z-perspective.

In step 922, the carbon is removed. The carbon is removed by ashing (e.g., $O_2$ plasma etching), in one embodiment. FIGS. 10h and 10i depict results after step 922. FIG. 10h shows that the amorphous silicon strips 1054 still cover the vertical sidewalls of the reversible resistivity material 532. FIG. 10i also shows the amorphous silicon strips 1054 still adjacent to the reversible resistivity material 532.

In step 924, a metal that will form a silicide with the silicon is deposited into the trenches. The metal is nickel in one embodiment. The metal is cobalt in one embodiment. The metal is deposited by sputtering, in one embodiment. The metal may deposited as a conformal layer over the amorphous silicon strips 1054. FIGS. 10j and 10k depict results after step 924. The metal 1056 is depicted as covering the vertical sidewalls of the amorphous silicon strips 1054. The metal 1056 also covers the horizontal surface of the amorphous silicon strips at the bottom of the trenches. FIG. 10k depicts how the metal 1056 may also cover exposed vertical sidewalls of the reversible resistivity material 532, as well as the amorphous silicon strips 1054.

In step 926, silicide is formed from at least a portion of the amorphous silicon strips and from at least a portion of the metal. A siliciding anneal may be performed in step 926. FIGS. 10l and 10m depict results after step 926. These figures show how a silicide 546 is formed between the silicon strips 1054 and the metal 1056. It is possible that some crystallization of the amorphous silicon occurs during this step. The silicide 546 extends vertically from the top to the bottom of the trenches in this example. There may also be some silicide formed at the bottom of the trenches between the horizontal portion of the metal 546 and silicon 1054.

In step 928, unreacted metal is removed. The unreacted metal may be removed by a wet cleaning process such as, $H_2SO_4+H_2O_2$. FIGS. 10n and 10o depict results after step 928. These figures show the silicide 546 still remains, but that the unreacted metal has been removed.

In step 930, etching at the bottom of the trenches to cut through horizontal portions of the silicide, the silicon, the reversible resistivity material, and the etch stop layer 511. This step may expose the upper S/D of the select transistors. A dry isotropic etch is used in one example. FIG. 10p depicts results after step 930. The etch has created an opening 77 at the bottom of the trenches, such that region 508 is exposed. The etch could etch partway into region 508.

At step 932, silicon is deposited in the trenches. In one embodiment, the silicon is highly-doped N+ polysilicon. A crystallizing anneal may also be performed in step 932. Thus, the newly deposited silicon may be turned to polysilicon. FIGS. 10q and 10r depicts the results of step 932 in one embodiment. The polysilicon 1058 covers vertical sidewalls of the silicide 546. The polysilicon 1058 also makes contact with region 508 of the select transistors. Note that FIG. 10r shows that the polysilicon 1058 fills the entire trench.

In step 934 etchings is performed to create the final shape for the vertical bit lines. The etch may be an anisotropic dry etch. This etch may use the mixed gas BRr and $Cl_2$. A mask formed from an oxide file (e.g. dTEOS) may be used. FIG. 10s depicts the results of step 936 in one embodiment. At this point the final shape of the vertical bits lines has taken shape. The etch has created separation between the vertical bit lines. Each bit line includes polycrystalline region 548a, silicide region 546a, polycrystalline region 548b, silicide region 546b, and polycrystalline region 548c.

In step 936, insulation is deposited between vertical bit lines. FIG. 10t depicts the results of step 936 in one embodiment. Insulating region 555 may be, for example, silicon oxide. Many other insulators could be used. Thus, a structure similar to that of FIGS. 8A-8C has been fabricated.

Figure 11A:
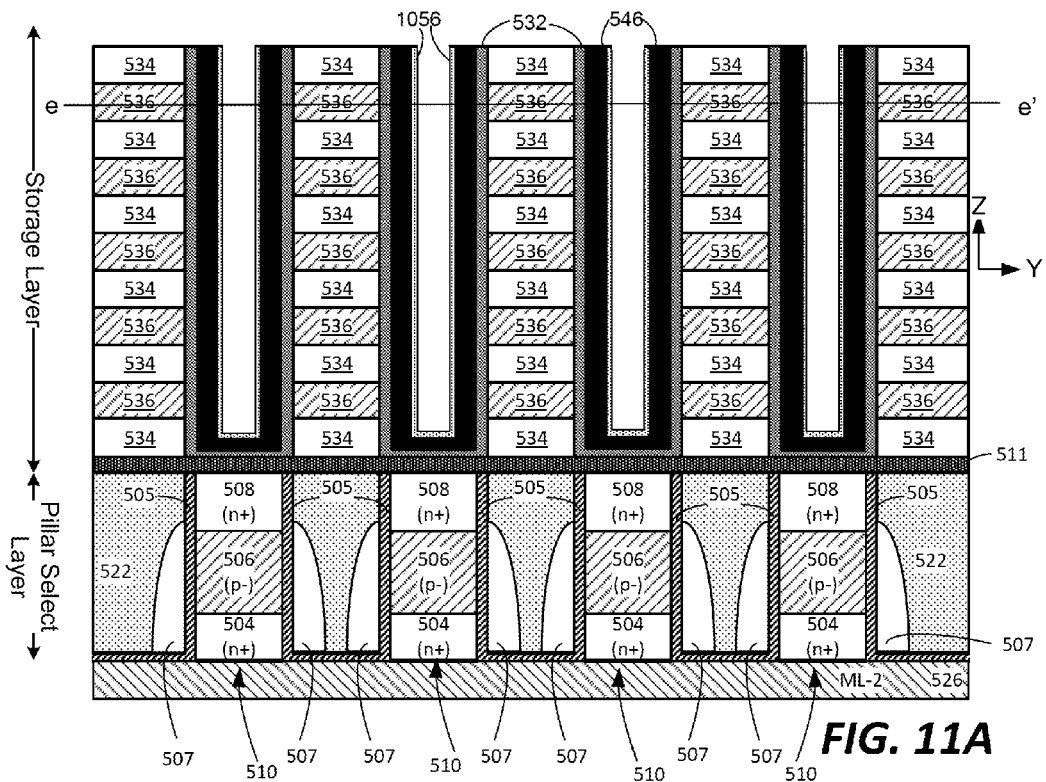
FIGS. 11a and 11b depict results after step 926 of one embodiment of the process of FIG. 9.
Figure 11B:
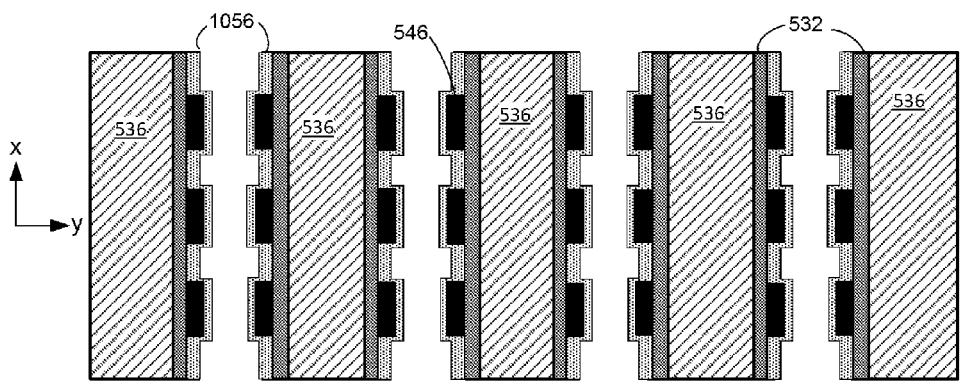

In one embodiment, a structure similar to that of FIGS. 8D-8F is fabricated. The process may begin similar to process 900 by performing steps 902-926. A difference in this embodiment is that when forming the silicide in step 926, all of the silicon adjacent to the reversible resistivity material 532 is converted to silicide. FIGS. 11a and 11b depict results after step 926 such an embodiment. FIG. 11a is a perspective similar to FIG. 8D. FIG. 11b depicts a cross section along line e-e' from FIG. 11a. FIGS. 11a and 11b depict silicide 546 covering the vertical sidewalls of the reversible resistivity material 532. As noted, the silicon has all been converted to silicide 546. A portion of the metal 1056 remains unreacted. The process may then continue in a similar manner as process 900 to remove the unreacted metal, etc. Thus, a structure similar to that of FIGS. 8D-8F may be fabricated.

Figure 12:
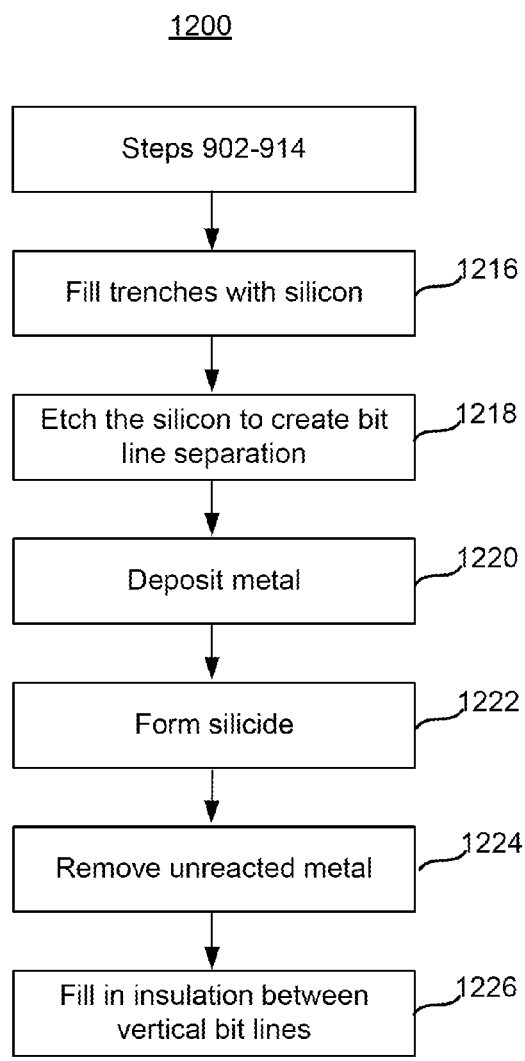
FIG. 12 is a flowchart of one embodiment of a process of fabricating a memory array in which the entire vertical bit line is formed by silicide.
Figure 13A:
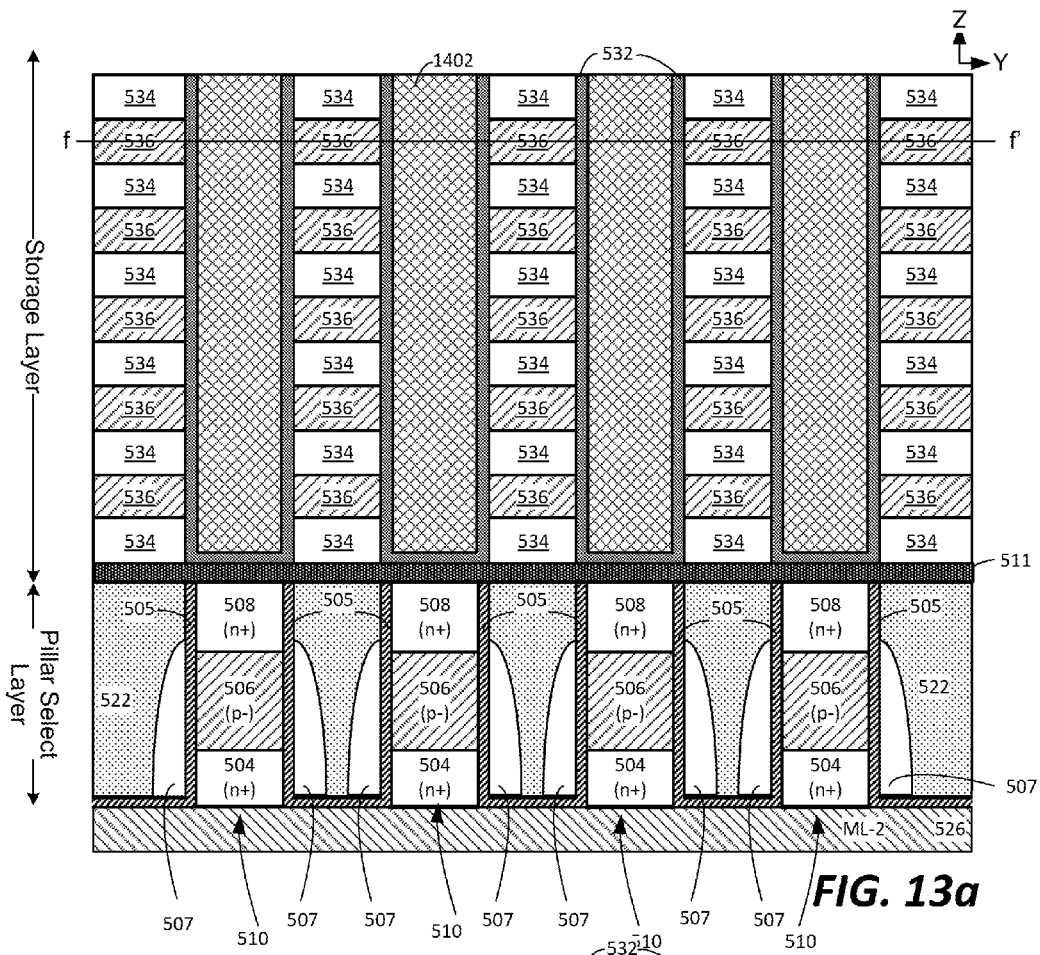
Figure 13B:
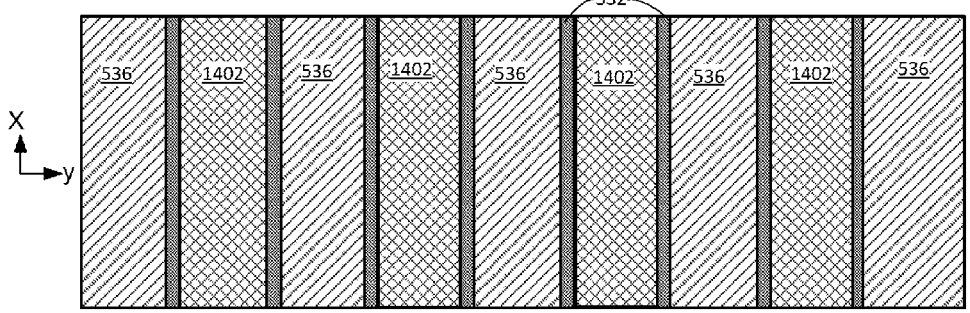

In one embodiment, a structure similar to that of FIGS. 8G-8I is fabricated. Recall that in those Figures, the entire vertical bit line is formed by the silicide. FIG. 12 is a flowchart of one embodiment of a process 1200 of fabricating a memory array in which the entire vertical bit line is formed by silicide. FIGS. 13a-13h depict results during one embodiment of process 1200. The process 1200 may begin similar to steps 902-914 of process 900. However, rather than performing steps 916 and 918 to fill the trenches with amorphous silicon and carbon, the trenches are filled with just amorphous silicon in step 1216. FIGS. 13a and 13b depict results after step 1216. FIGS. 13a and 13b show amorphous silicon 1402 filling the trenches. FIG. 13b depicts a cross section along line f-f' from FIG. 13a. The amorphous silicon 1402 covers the vertical sidewalls of the reversible resistivity material 532. The amorphous silicon 1402 also covers a horizontal surface of the reversible resistivity material 532 at the bottom of the trenches.

In step 1218, the silicon is etched to form separation between the silicon for what will eventually be the vertical bit lines. Results are step 1218 are depicted in FIG. 13c. FIG. 13c shows amorphous silicon strips 1404. These amorphous silicon strips 1404 may extend in the z-direction from about the top of the trenches to about the bottom of the trenches. Note that FIG. 13c does not depict the z-perspective.

In step 1220, metal is deposited. The metal is deposited by sputtering, in one embodiment. The metal may be nickel or cobalt, but is not limited to those metals. This deposition may be a conformal layer over the silicon. Results are step 1220 are depicted in FIG. 13d. The metal 1406 may cover vertical sidewalls of the silicon. The metal 1406 may extend in the z-direction from about the top of the trenches to about the bottom of the trenches. Note that FIG. 13*d* does not depict the z-perspective.

In step 1222, silicide is formed. Results are step 1222 are depicted in FIG. 13*e*. In this embodiment, all of the silicon 1404 has been converted to silicide. Note that silicide region 546*a* may be somewhat larger than the former silicon region 1404. The silicide 546*e* extends entirely from the region of the reversible resistivity material 532 on one side of the trench to the reversible resistivity material 532 on the other side of the trench. The silicide 546*e* may extend in the z-direction from about the top of the trenches to about the bottom of the trenches.

In step 1224 any unreacted metal is removed. Results are step 1224 are depicted in FIG. 13*f*.

Figures 13G, 13H:
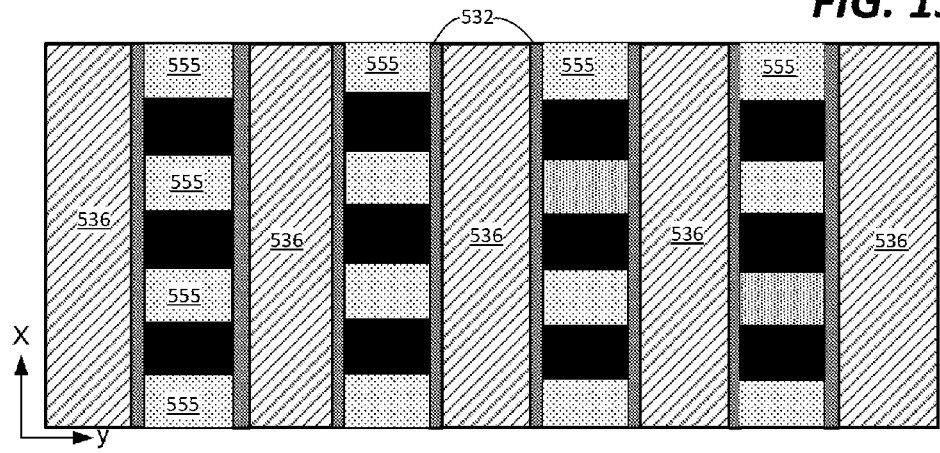

In step 1226 spaces between the vertical bit lines are filled with insulation. Results after step 1226 are depicted in FIGS. 13*g* and 13*h*. These Figures show that the silicide 546*e* forms the entire vertical bit line 1330. The silicide 546*e* may be in direct contact with the reversible resistivity material 532. Thus, a structure similar to those in FIGS. 8*g*-8*i* has been formed. Note also that the silicide 546*e* contacts region 508 of the select transistor.

Accordingly, there is described a method fabricating non-volatile storage, comprising forming a plurality of word lines, forming reversible resistivity material adjacent to the plurality of word lines, and forming a plurality of bit lines that comprise a silicide. The reversible resistivity material resides between the word lines and the bit lines.

In one embodiment, forming the bit lines in the example of the previous paragraph comprises forming a silicon region in contact with the reversible resistivity material, forming a metal region in contact with the silicon region, and performing a siliciding anneal after forming the metal region in contact with the silicon region.

In one embodiment, in the non-volatile storage in either of the previous two paragraphs, the plurality of word lines comprise titanium nitride, the reversible resistivity material comprises a metal oxide, and the plurality of bit lines comprise polycrystalline silicon and the silicide.

In one embodiment, forming the non-volatile storage in any of the three previous paragraphs, further comprises: forming a plurality of global bit lines over a substrate having a major surface that extends horizontally, wherein the plurality of word lines extend horizontally with respect to the major surface of the substrate, wherein the silicide extends vertically with respect to the major surface of the substrate; and forming a plurality of select devices over the plurality of global bit lines, wherein the plurality of select devices reside between the plurality of global bit lines and the plurality vertical bit lines.

Accordingly, there is described a non-volatile storage system, comprising a plurality of word lines, a plurality bit lines that comprise a silicide; and reversible resistance switching material between respective ones of the word lines and respective ones of the vertical bit lines.

In one embodiment, in the non-volatile storage system of the previous paragraph, the plurality of word lines comprise titanium nitride, the reversible resistivity material comprises metal oxide, and the plurality of bit lines comprise polycrystalline silicon and the silicide.

In one embodiment, the non-volatile storage system of either of the two previous paragraphs further comprises: a substrate having a major surface that extends horizontally, wherein the plurality of word lines extend horizontally with respect to the major surface of the substrate, wherein the silicide extends vertically with respect to the major surface of the substrate; a plurality of global bit lines over the substrate; and a plurality of select devices that reside between the plurality of global bit lines and the plurality of bit lines.

Accordingly, there is described a method fabricating a non-volatile storage device that comprises the following. A plurality of global bit lines are formed over a substrate having a major surface that extends horizontally. A plurality of vertical transistor select devices are formed over the plurality of global bit lines. A plurality of word line layers are formed alternating with a plurality of insulating layers over the vertical transistor select devices, wherein the plurality of word line layers extend horizontally with respect to the major surface of the substrate. The plurality of insulating layers and the plurality of word line layers are etched to form a plurality of stacks comprising insulating lines and word lines, the stacks having vertical sidewalls. Reversible resistivity material is formed on the vertical sidewalls of the stacks, the reversible resistivity material having vertical sidewalls. Vertical bit lines are formed between the stacks. Forming the vertical bit lines comprises: forming silicon on the vertical sidewalls of the reversible resistivity material, the silicon having vertical sidewalls; forming a metal on the vertical sidewalls of the silicon; forming a silicide from at least a portion of the silicon and at least a portion of the metal; and removing any unreacted metal after performing the silicide.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile storage, comprising:
   forming a plurality of word lines;
   forming reversible resistivity material adjacent to the plurality of word lines; and
   forming a plurality of bit lines that comprise a silicide, wherein the reversible resistivity material resides between the word lines and the bit lines, wherein forming the plurality of bit lines comprises:
      forming a silicon region in contact with the reversible resistivity material;
      forming a metal region in contact with the silicon region; and
      performing a siliciding anneal after forming the metal region in contact with the silicon region.

2. The method of claim 1, wherein forming the plurality of bit lines comprises:
   forming a polycrystalline silicon region between the reversible resistivity material and the silicide.

3. The method of claim 1, wherein forming the plurality of bit lines comprises:
   forming a region of the silicide between the reversible resistivity material and a polycrystalline silicon region.

4. The method of claim 1, wherein forming the plurality of bit lines comprises:
   forming an entire bit line from the silicide.

5. The method of claim 1, wherein forming the plurality of bit lines that comprise the silicide comprises:
   forming nickel-silicide.

6. The method of claim 1, wherein forming the plurality of bit lines that comprise the silicide comprises:
   forming cobalt-silicide.

7. The method of claim 1, wherein:
   the plurality of word lines comprise titanium nitride;
   the reversible resistivity material comprises a metal oxide; and
   the plurality of bit lines comprise polycrystalline silicon and the silicide.

8. The method of claim 7, wherein the polycrystalline silicon is in direct contact with the metal oxide.

9. The method of claim 1, further comprising:
   forming a plurality of global bit lines over a substrate having a major surface that extends horizontally, wherein the plurality of word lines extend horizontally with respect to the major surface of the substrate, wherein the silicide extends vertically with respect to the major surface of the substrate, wherein the plurality of bit lines extend vertically with respect to the major surface of the substrate; and
   forming a plurality of select transistors over the plurality of global bit lines, wherein the plurality of select transistors reside between the plurality of global bit lines and the plurality of vertical bit lines.

10. The method of claim 1, wherein the reversible resistivity material comprises a metal oxide.

11. A non-volatile storage system, comprising:
    a plurality of word lines;
    a plurality of bit lines that comprise polycrystalline silicon and a silicide; and
    a reversible resistivity switching material between respective ones of the word lines and respective ones of the bit lines, a region of the polycrystalline silicon resides between the reversible resistivity switching material and a region of the silicide.

12. The non-volatile storage system of claim 11, wherein the silicide is a metal silicide.

13. The non-volatile storage system of claim 11, wherein the silicide is a cobalt silicide.

14. The non-volatile storage system of claim 11, wherein the silicide is a nickel silicide.

15. The non-volatile storage system of claim 11, wherein:
    the plurality of word lines comprise titanium nitride; and
    the reversible resistivity switching material comprises a metal oxide.

16. The non-volatile storage system of claim 11, further comprising:
    a substrate having a major surface that extends horizontally, wherein the plurality of word lines extend horizontally with respect to the major surface of the substrate, wherein the silicide extends vertically with respect to the major surface of the substrate, wherein the plurality of bit lines extend vertically with respect to the major surface of the substrate;
    a plurality of global bit lines over the substrate; and
    a plurality of select transistors that reside between the plurality of global bit lines and the plurality of vertical bit lines.

17. The non-volatile storage system of claim 11, wherein the reversible resistivity switching material comprises a metal oxide.

18. The non-volatile storage system of claim 11, further comprising:
    a substrate; and
    a monolithic three dimensional memory array comprising multiple memory levels that resides above the substrate, wherein the monolithic three dimensional memory array comprises memory cells that comprise the reversible resistivity switching material.

19. A method of fabricating a non-volatile storage device, the method comprising:
    forming a plurality of global bit lines over a substrate having a major surface that extends horizontally;
    forming a plurality of vertical select transistors over the plurality of global bit lines;
    forming a plurality of word line layers alternating with a plurality of insulating layers over the vertical select transistors, wherein the plurality of word line layers extend horizontally with respect to the major surface of the substrate;
    etching the plurality of insulating layers and the plurality of word line layers to form a plurality of stacks comprising insulating lines and word lines, the stacks having vertical sidewalls;
    forming reversible resistivity material on the vertical sidewalls of the stacks, the reversible resistivity material having vertical sidewalls; and
    forming vertical bit lines between the stacks, wherein forming the vertical bit lines comprises:
       forming silicon on the vertical sidewalls of the reversible resistivity material, the silicon having vertical sidewalls;
       forming a metal on the vertical sidewalls of the silicon;
       forming a silicide from at least a portion of the silicon and at least a portion of the metal; and
    removing any unreacted metal after performing the silicide.

20. The method of claim 19, wherein the reversible resistivity material comprises a metal oxide.

21. A non-volatile storage system, comprising:
    a plurality of word lines;
    a plurality of bit lines that are formed entirely from a silicide; and
    a reversible resistivity switching material between respective ones of the word lines and respective ones of the bit lines.

22. A non-volatile storage system, comprising:
    a substrate having a major surface that extends horizontally;
    a plurality of word lines that extend horizontally with respect to the major surface of the substrate;
    a plurality of vertical bit lines that comprise a silicide that extends vertically with respect to the major surface of the substrate;
    a reversible resistivity switching material between respective ones of the word lines and respective ones of the vertical bit lines;
    a plurality of global bit lines over the substrate; and
    a plurality of select transistors that reside between the plurality of global bit lines and the plurality of vertical bit lines.

23. A method of fabricating non-volatile storage, comprising:
    forming a plurality of word lines;
    forming reversible resistivity material adjacent to the plurality of word lines; and
    forming a plurality of bit lines that comprise a silicide, wherein the reversible resistivity material resides between the word lines and the bit lines, wherein forming the plurality of bit lines comprises forming an entire bit line from the silicide.

24. A method of fabricating non-volatile storage, comprising:
   forming a plurality of word lines;
   forming reversible resistivity material adjacent to the plurality of word lines; and
   forming a plurality of bit lines that comprise polycrystalline silicon and a silicide, wherein the polycrystalline silicon is in direct contact with the reversible resistivity material, wherein the reversible resistivity material resides between the word lines and the bit lines.

25. The method of claim 24, wherein:
   the plurality of word lines comprise titanium nitride; and
   the reversible resistivity material comprises a metal oxide.

* * * * *